US010638617B2

(12) United States Patent
Tossavainen et al.

(10) Patent No.: US 10,638,617 B2
(45) Date of Patent: Apr. 28, 2020

(54) DISPLAY APPARATUS

(75) Inventors: Antero Tossavainen, Oulu (FI); Vesa Kajanus, Oulunsalo (FI); Petri Soronen, Oulu (FI)

(73) Assignee: Nokia Technologies Oy, Espoo (FI)

( * ) Notice: Subject to any disclaimer, the term of this patent is extended or adjusted under 35 U.S.C. 154(b) by 1085 days.

(21) Appl. No.: 13/880,439

(22) PCT Filed: Oct. 19, 2010

(86) PCT No.: PCT/IB2010/054726
§ 371 (c)(1),
(2), (4) Date: Jun. 10, 2013

(87) PCT Pub. No.: WO2012/052803
PCT Pub. Date: Apr. 26, 2012

(65) Prior Publication Data
US 2013/0250502 A1 Sep. 26, 2013

(51) Int. Cl.
*H05K 5/00* (2006.01)
*G06F 3/0488* (2013.01)
(Continued)

(52) U.S. Cl.
CPC .......... *H05K 5/0017* (2013.01); *G06F 3/016* (2013.01); *G06F 3/0488* (2013.01); *H04M 1/0266* (2013.01); *H04M 1/03* (2013.01); *H04M 1/605* (2013.01); *H04R 7/04* (2013.01); *H04R 7/045* (2013.01); *H05K 13/00* (2013.01); *H04M 1/62* (2013.01); *H04R 1/028* (2013.01); *H04R 3/04* (2013.01); *H04R 17/00* (2013.01); *H04R 2400/03* (2013.01); *H04R 2440/05* (2013.01); *H04R 2499/11* (2013.01); *Y10T 29/49002* (2015.01)

(58) Field of Classification Search
CPC combination set(s) only.
See application file for complete search history.

(56) References Cited

U.S. PATENT DOCUMENTS 6,337,678 B1 * 1/2002 Fish .............................. 345/156
7,148,789 B2 * 12/2006 Sadler et al. .............. 340/407.1
(Continued)

FOREIGN PATENT DOCUMENTS

EP     1544720 A1     6/2005
EP     2202619 A1     6/2010
(Continued)

OTHER PUBLICATIONS

International Search Report received for corresponding Patent Cooperation Treaty Application No. PCT/IB2010/054726, dated Jun. 1, 2011, 12 pages.

*Primary Examiner* — Amare Mengistu
*Assistant Examiner* — Crystal Mathews
(74) *Attorney, Agent, or Firm* — Harrington & Smith

(57) ABSTRACT

An apparatus comprising: a first part configured to form at least part of the case of the apparatus; a second part configured to form at least part of the display for the apparatus; a coupling configured to couple the first part to the second part; and at least one actuator coupled to the second part and configured to apply a force to the second part to generate a displacement of the second part relative to the first part suitable for generating an audio signal.

25 Claims, 13 Drawing Sheets

(51) Int. Cl.
*G06F 3/01* (2006.01)
*H04M 1/03* (2006.01)
*H04R 7/04* (2006.01)
*H04M 1/02* (2006.01)
*H04M 1/60* (2006.01)
*H05K 13/00* (2006.01)
*H04M 1/62* (2006.01)
*H04R 3/04* (2006.01)
*H04R 17/00* (2006.01)
*H04R 1/02* (2006.01)

(56) References Cited

U.S. PATENT DOCUMENTS

| | | | | |
|---|---|---|---|---|
| 7,342,573 | B2* | 3/2008 | Ryynanen | 345/173 |
| 7,391,879 | B2* | 6/2008 | Beer et al. | 381/423 |
| 7,869,589 | B2* | 1/2011 | Tuovinen | 379/433.07 |
| 8,310,458 | B2* | 11/2012 | Faubert et al. | 345/173 |
| 8,736,558 | B2* | 5/2014 | East | G06F 3/016 |
| | | | | 345/173 |
| 2003/0067449 | A1* | 4/2003 | Yoshikawa et al. | 345/173 |
| 2005/0231313 | A1* | 10/2005 | Shahoian | 335/220 |
| 2006/0022958 | A1* | 2/2006 | Shiga | 345/173 |
| 2008/0084384 | A1* | 4/2008 | Gregorio et al. | 345/156 |
| 2008/0146289 | A1 | 6/2008 | Korneluk et al. | |
| 2008/0254822 | A1* | 10/2008 | Tilley | 455/550.1 |
| 2008/0259094 | A1* | 10/2008 | Kim et al. | 345/651 |
| 2009/0002328 | A1* | 1/2009 | Ullrich et al. | 345/173 |
| 2009/0034758 | A1* | 2/2009 | Ko et al. | 381/152 |
| 2009/0085878 | A1* | 4/2009 | Heubel et al. | 345/173 |
| 2010/0073304 | A1* | 3/2010 | Grant et al. | 345/173 |
| 2010/0141408 | A1 | 6/2010 | Doy et al. | |
| 2010/0156818 | A1* | 6/2010 | Burrough et al. | 345/173 |
| 2010/0156824 | A1 | 6/2010 | Paleczny et al. | |
| 2010/0171715 | A1 | 7/2010 | Peterson et al. | |
| 2010/0231550 | A1* | 9/2010 | Cruz-Hernandez et al. | |
| | | | | 345/174 |
| 2010/0267424 | A1* | 10/2010 | Kim et al. | 455/566 |
| 2011/0003124 | A1* | 1/2011 | Hatanaka et al. | 428/202 |
| 2012/0038568 | A1* | 2/2012 | Colloms | G06F 3/016 |
| | | | | 345/173 |
| 2012/0047380 | A1* | 2/2012 | Nurmi | 713/320 |
| 2012/0229424 | A1* | 9/2012 | Behles et al. | 345/177 |
| 2013/0207793 | A1* | 8/2013 | Weaber et al. | 340/407.2 |
| 2014/0145836 | A1* | 5/2014 | Tossavainen et al. | 340/407.2 |
| 2014/0281957 | A1* | 9/2014 | Weng et al. | 715/702 |
| 2015/0062031 | A1* | 3/2015 | Kono | 345/173 |

FOREIGN PATENT DOCUMENTS

| | | | |
|---|---|---|---|
| WO | WO 2009067708 A1 * | 5/2009 | G06F 3/01 |
| WO | WO-2009074826 A1 | 6/2009 | |
| WO | WO-2010092397 A1 | 8/2010 | |

* cited by examiner

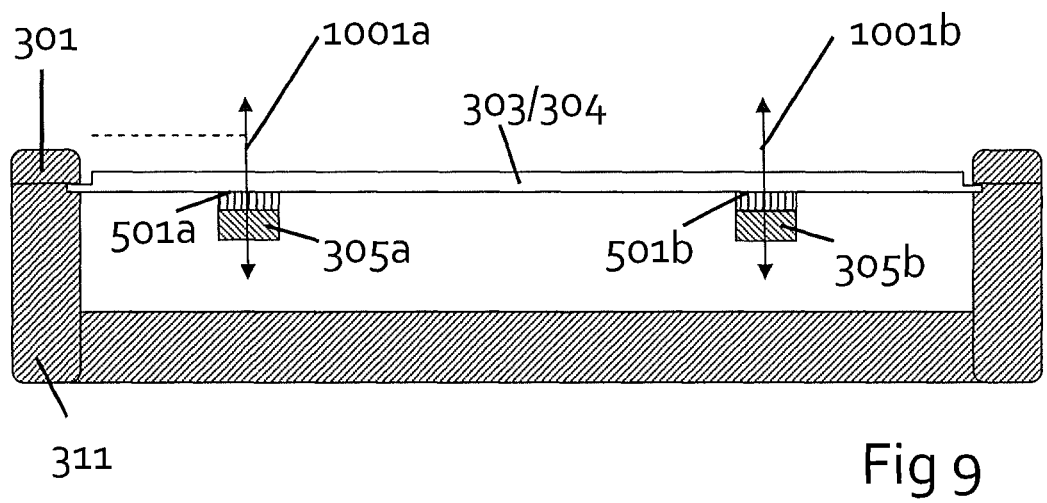
Fig 9
Fig 10
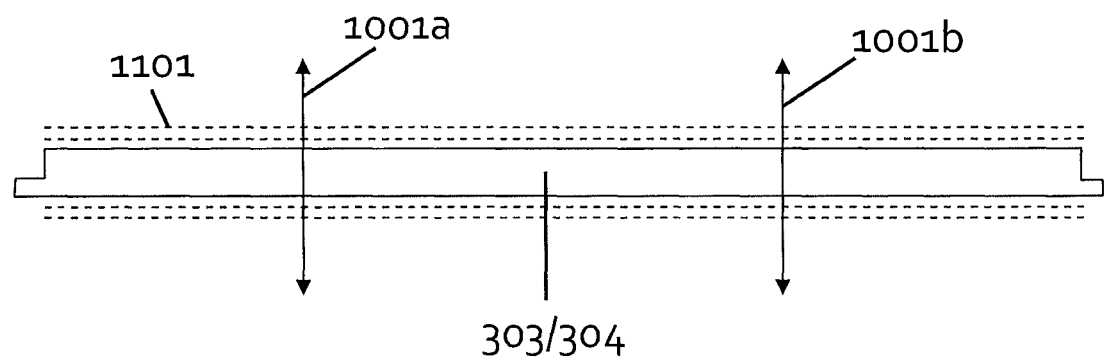
Fig 11
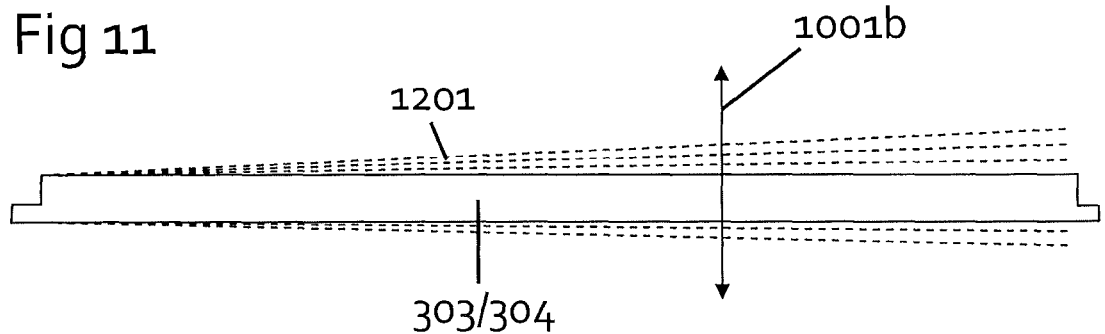

DISPLAY APPARATUS

RELATED APPLICATION

This application was originally filed as Patent Cooperation Treaty Application No. PCT/IB2010/054726 filed Oct. 19, 2010.

FIELD OF THE APPLICATION

The present invention relates to a display apparatus providing speaker functionality. The invention further relates to, but is not limited to, display apparatus providing speaker functionality for use in mobile devices.

BACKGROUND OF THE APPLICATION

Many portable devices, for example mobile telephones, are equipped with a display such as a glass or plastic display window for providing information to the user. Furthermore such display windows are now commonly used as touch sensitive inputs. The use of a touch sensitive input with the display has the advantage over a mechanical keypad in that the display may be configured to show a range of different inputs depending on the operating mode of the device. For example, in a first mode of operation the display may be enabled to enter a phone number by displaying a simple numeric keypad arrangement and in a second mode the display may be enabled for text input by displaying an alphanumeric display configuration such as a simulated Qwerty keyboard display arrangement. However such touchscreen inputs have a disadvantage with respect to mechanical keys in that the user does not experience the usual expected click or mechanical switch feedback to indicate that an input has been detected.

To attempt to overcome this some equipment has been provided with a mechanical or audible simulation of a key press. This feedback is known as haptic feedback when felt. Device-haptic feedback where the device is vibrated however requires significant current to operate in order to generate significant feedback force.

Furthermore some equipment can be equipped with so called singing display technology whereby the display technology can be moved by compressing a liquid crystal display layer between two layers of electrodes to generate an acoustic wave. However singing displays require specific display/electrode construction which leads to complex, expensive and inflexible displays and furthermore is limited to only some display technologies.

This application proceeds from the consideration that the provision of a flexible display driving mechanism capable of transferring the force provided by an actuator to the user by flexing and not significantly damping the force may provide both the physical and mechanical support for the display without unduly limiting the action of the display in producing tactile or haptic feedback and audio speaker functionality.

It is an aim of at least some embodiments of the invention to address one or more of these problems.

STATEMENT OF THE APPLICATION

According to an aspect, there is provided an apparatus comprising an apparatus comprising: a first part configured to form at least part of the case of the apparatus; a second part configured to form at least part of the display for the apparatus; a coupling configured to couple the first part to the second part; and at least one actuator coupled to the second part and configured to apply a force to the second part to generate a displacement of the second part relative to the first part suitable for generating an audio signal.

The coupling may be an elastic material affixed to the first part and the second part.

The elastic material may be at least one of silicone, thermoplastic elastomer (TPE); thermoplastic polyurethane (TPU); and rubber.

The first part may comprise: a body part; and a frame part, at least partially framing the second part, wherein the coupling may be configured to be affixed between the frame part and an associated section of the second part.

The coupling may be configured to produce a substantially continuous interface between the first part and the second part.

The second part may comprise: a front window layer; at least one display layer; and at least one touch interface layer.

The at least one actuator may comprise at least two actuators, the apparatus may be configured to: in a first mode of operation, operate the at least two actuators to generate a displacement of the second part relative to the first part substantially to the whole of the second part; and in a second mode of operation, operate a sub-group of the at least two actuators to generate a substantially localised displacement of the second part.

The apparatus may further comprise a driver configured to drive at least one of the at least two actuators dependent on a mode determination signal.

The mode determination signal may comprise at least one of: a hands-free mode determination signal, wherein the driver is configured to drive the at least two actuators; and a hands-portable mode determination signal, wherein the driver is configured to drive a sub-group of the at least two actuators to generate the substantially localised displacement.

The apparatus may further comprise a mode determiner configured to determine a mode determination signal dependent on at least one of: at least one proximity sensor; an apparatus orientation sensor; and an apparatus operating system setting.

The at least one actuator may be configured to be operated dependent on at least one power characteristic of the apparatus.

The power characteristic of the apparatus may comprise at least one of: electrical power consumption of at least part of the apparatus; battery capacity of the apparatus; and estimated time to battery discharge of the apparatus.

The apparatus may further comprise a filter configured to filter a signal to operate the at least one actuator dependent on the at least one power characteristic of the apparatus.

The filter may comprise at least one of: a low pass filter; an equaliser; and a band pass filter.

The apparatus may further comprise a filter controller configured to apply the filter when a power characteristic value is significant when compared to a threshold value.

The filter may be an adjustable filter wherein the filter is adaptively controlled dependent on a power characteristic value.

The at least one actuator may be at least one of: a piezoelectric actuator; a dynamic eccentric mass actuator; a moving coil actuator; and a moving magnet actuator.

The apparatus may further comprise a damper coupled between the at least one actuator and the second part to convert an actuator bending moment to a second part substantially linear displacement.

According to a second aspect there is provided a method comprising: providing a first part configured to form at least part of the case of the apparatus; providing a second part configured to form at least part of the display for the apparatus; coupling the first part to the second part; and applying a force to the second part by at least one actuator coupled to the second part to generate a displacement of the second part relative to the first part suitable for generating an audio signal.

Coupling the first part to the second part may comprise affixing an elastic material to the first part and the second part.

The elastic material may be at least one of silicone, thermoplastic elastomer (TPE); thermoplastic polyurethane (TPU); and rubber.

The first part may comprise: a body part; and a frame part, the method may further comprise at least partially framing the second part with the frame part.

Coupling the first part to the second part may comprise affixing the elastic material between the frame part and an associated section of the second part.

Coupling may further comprise producing a substantially continuous interface between the first part and the second part.

The second part may comprise: a front window layer; at least one display layer; and at least one touch interface layer.

The at least one actuator may comprise at least two actuators and the method may comprise: operating, in a first mode, the at least two actuators to generate a displacement of the second part relative to the first part substantially to the whole of the second part; and operating, in a second mode, a sub-group of the at least two actuators to generate a substantially localised displacement of the second part.

Operating, in a first mode, the at least two actuators to generate a displacement of the second part relative to the first part substantially to the whole of the second part may comprise generating a substantially translational motion of the second part.

Operating, in a second mode, a sub-group of the at least two actuators to generate a substantially localised displacement of the second part may comprise generating a substantially rotational motion of the second part about a pivot defined by an interface between the first and second parts.

The method may further comprise driving at least one of the at least two actuators dependent on a mode determination signal.

The mode determination signal may comprise at least one of: a hands-free mode determination signal, wherein driving at least one of the at least two actuators dependent on a mode determination signal may comprise driving the at least two actuators; and a hands-portable mode determination signal, wherein driving at least one of the at least two actuators dependent on a mode determination signal may comprise driving a sub-group of the at least two actuators to generate the substantially localised displacement.

The method may further comprise determining the mode determination signal dependent on at least one of: at least one proximity sensor; an apparatus orientation sensor; and an apparatus operating system setting.

The method may further comprise operating the at least one actuator dependent on at least one power characteristic of the apparatus.

The power characteristic of the apparatus may comprise at least one of: electrical power consumption of at least part of the apparatus; battery capacity of the apparatus; and estimated time to battery discharge of the apparatus.

Operating the at least one actuator dependent on at least one power characteristic may comprise filtering a signal to operate the at least one actuator.

Filtering a signal to operate the at least one actuator may comprise at least one of: low pass filtering; equaliser filtering; and band pass filtering.

The method may further comprise controlling the filter to selectively apply the filter when a power characteristic value is significant when compared to a threshold value.

The method may further comprise controlling the filter to selectively adjust the filter performance dependent on a power characteristic value.

The at least one actuator may be at least one of: a piezoelectric actuator; a dynamic eccentric mass actuator; a moving coil actuator; and a moving magnet actuator.

The method may further comprise coupling via a damper the at least one actuator and the second part to convert an actuator bending moment to a second part substantially linear displacement.

According to a third aspect there is provided apparatus comprising: first structure means for forming at least part of the case of the apparatus; second structure means for forming at least part of the display for the apparatus; coupling means for coupling the first structure means to the second structure means; and actuating means for applying a force to the second structure means to generate a displacement of the second structure means relative to the first structure means suitable for generating an audio signal.

The coupling means may comprise an elastic material affixing the first structure means and the second structure means.

The elastic material may be at least one of silicone, thermoplastic elastomer (TPE); thermoplastic polyurethane (TPU); and rubber.

The first structure means may comprise: a body part; and a frame part, the method may further comprise at least partially framing the second part with the frame part.

The coupling means may affix the elastic material between the frame part and an associated section of the second structure means.

The coupling means may further produce a substantially continuous interface between the first structure means and the second structure means.

The second structure means may comprise: a front window layer; at least one display layer; and at least one touch interface layer.

The actuating means may comprise at least two actuators configured to operate, in a first mode, the at least two actuators to generate a displacement of the second structure means relative to the first structure means substantially to the whole of the second structure means; The actuating means may comprise at least two actuators configured to operate in a second mode, a sub-group of the at least two actuators to generate a substantially localised displacement of the second structure means.

Operating, in a first mode, the at least two actuators to generate a displacement of the second structure means relative to the first part substantially to the whole of the second structure means may comprise generating a substantially translational motion of the second structure means.

Operating, in a second mode, a sub-group of the at least two actuators to generate a substantially localised displacement of the second structure means may comprise generating a substantially rotational motion of the second part about a pivot defined by an interface between the first and second structure means.

The apparatus may further comprise driving means for driving at least one of the at least two actuators dependent on a mode determination signal.

The mode determination signal may comprise at least one of: a hands-free mode determination signal, wherein the driving may drive at least one of the at least two actuators dependent on a mode determination signal may comprise driving the at least two actuators; and a hands-portable mode determination signal, wherein the driving means may drive at least one of the at least two actuators dependent on a mode determination signal may comprise driving a sub-group of the at least two actuators to generate the substantially localised displacement.

The apparatus may further comprise determining means for determining the mode determination signal dependent on at least one of: at least one proximity sensor; an apparatus orientation sensor; and an apparatus operating system setting.

The apparatus may further comprise controlling means for operating the at least one actuator dependent on at least one power characteristic of the apparatus.

The power characteristic of the apparatus may comprise at least one of: electrical power consumption of at least part of the apparatus; battery capacity of the apparatus; and estimated time to battery discharge of the apparatus.

The controlling means may comprise a filter for filtering a signal to operate the at least one actuator.

The filter may comprise at least one of: a low pass filter; an equaliser filter; and a band pass filter.

The controlling means may selectively apply the filter when a power characteristic value is significant when compared to a threshold value.

The controlling means may selectively adjust the filter performance dependent on a power characteristic value.

The actuator means may be at least one of: a piezoelectric actuator; a dynamic eccentric mass actuator; a moving coil actuator; and a moving magnet actuator.

The actuator means may further comprise a coupling means for converting an actuator bending moment to a second part substantially linear displacement.

SUMMARY OF FIGURES

For better understanding of the present invention, reference will now be made by way of example to the accompanying drawings in which:

FIG. 9 shows a further detail of a sectioned view of some embodiments of the application demonstrating a multiple actuator configuration;

FIG. 10 shows a schematic view of the motion of the front window of a display when actuated by multiple actuators in a multiple actuator configuration according to some embodiments of the application;

FIG. 11 shows a schematic view of the motion of the front window of a display when actuated by only one of the actuators in a multiple actuator configuration according to some embodiments of the application;

DESCRIPTION OF EXAMPLE EMBODIMENTS

The application describes apparatus and methods of construction for apparatus suitable for generating touch screen devices capable of creating a more interactive user experience and audio generation through the screen. Thus as described hereafter in embodiments of the application, the use of a flexible membrane for connecting the display with the cover or case enables the display to be driven substantially in a linear manner. Driving the display in a linear rather than bending manner greatly enhances the user haptic experience and generates acoustic waves suitable for earpiece or speaker replacement. The construction of such a display module and some examples of its implementation within apparatus is described in further detail hereafter.

Figure 1:
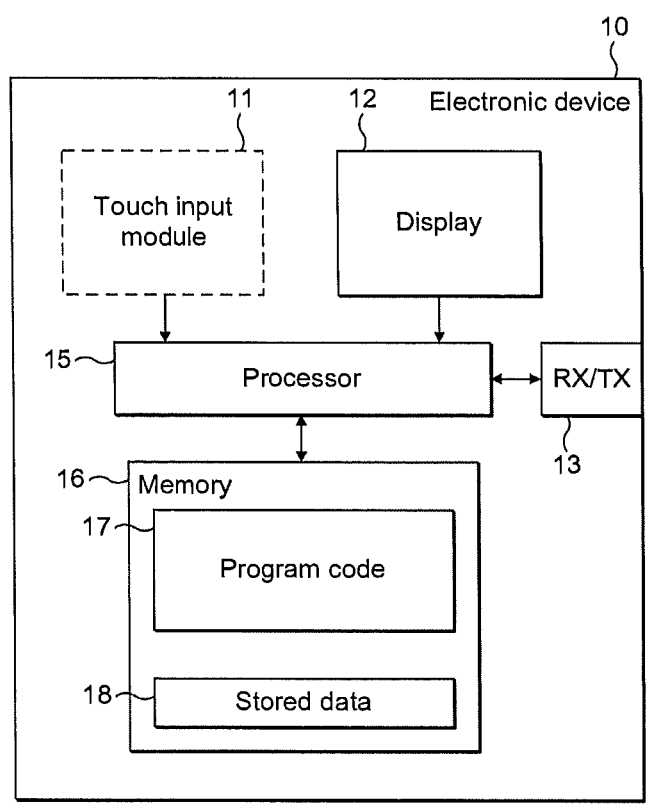
FIG. 1 shows schematically an apparatus suitable for employing embodiments of the application.

With respect to FIG. 1 a schematic block diagram of an example electronic device 10 or apparatus on which embodiments of the application can be implemented. The apparatus 10 is such embodiments configured to provide improved haptic feedback and audio generation.

The apparatus 10 is in some embodiments a mobile terminal, mobile phone or user equipment for operation in a wireless communication system. In other embodiments, the electronic device is any suitable electronic device configured to provide a image display, such as for example a digital camera, a portable audio player (mp3 player), a portable video player (mp4 player). In other embodiments the apparatus can be any suitable electronic device with touch interface (which may or may not display information) such as a touch-screen or touch-pad configured to provide feedback when the touch-screen or touch-pad is touched. For example in some embodiments the touch-pad can be a touch-sensitive keypad which can in some embodiments have no markings on it and in other embodiments have physical markings or designations on the front window. An example of such a touch sensor can be a touch sensitive user interface to replace keypads in automatic teller machines (ATM) that does not require a screen mounted underneath the front window projecting a display. The user can in such embodiments be notified of where to touch by a physical identifier—such as a raised profile, or a printed layer which can be illuminated by a light guide.

The apparatus 10 comprises a touch input module or user interface 11, which is linked to a processor 15. The processor 15 is further linked to a display 12. The processor 15 is further linked to a transceiver (TX/RX) 13 and to a memory 16.

In some embodiments, the touch input module 11 and/or the display 12 are separate or separable from the electronic device and the processor receives signals from the touch input module 11 and/or transmits and signals to the display 12 via the transceiver 13 or another suitable interface. Furthermore in some embodiments the touch input module 11 and display 12 are parts of the same component. In such embodiments the touch interface module 11 and display 12 can be referred to as the display part or touch display part.

The processor 15 can in some embodiments be configured to execute various program codes. The implemented program codes, in some embodiments can comprise such routines as touch capture digital processing or configuration code where the touch input module inputs are detected and processed, display image processing and image interaction code where the data to be passed to generate the display images is generated for example based on the detection of the input, or actuator processing generating an actuator signal for driving an actuator. The implemented program codes can in some embodiments be stored for example in the memory 16 and specifically within a program code section 17 of the memory 16 for retrieval by the processor 15 whenever needed. The memory 15 in some embodiments can further provide a section 18 for storing data, for example data that has been processed in accordance with the application, for example display information data.

The touch input module 11 can in some embodiments implement any suitable touch screen interface technology. For example in some embodiments the touch screen interface can comprise a capacitive sensor configured to be sensitive to the presence of a finger above or on the touch screen interface. The capacitive sensor can comprise an insulator (for example glass or plastic), coated with a transparent conductor (for example indium tin oxide—ITO). As the human body is also a conductor, touching the surface of the screen results in a distortion of the local electrostatic field, measurable as a change in capacitance. Any suitable technology may be used to determine the location of the touch. The location can be passed to the processor which may calculate how the user's touch relates to the device. The insulator protects the conductive layer from dirt, dust or residue from the finger.

In some other embodiments the touch input module can be a resistive sensor comprising of several layers of which two are thin, metallic, electrically conductive layers separated by a narrow gap. When an object, such as a finger, presses down on a point on the panel's outer surface the two metallic layers become connected at that point: the panel then behaves as a pair of voltage dividers with connected outputs. This physical change therefore causes a change in the electrical current which is registered as a touch event and sent to the processor for processing.

In some other embodiments the touch input module can further determine a touch using technologies such as visual detection for example a camera either located below the surface or over the surface detecting the position of the finger or touching object, projected capacitance detection, infra-red detection, surface acoustic wave detection, dispersive signal technology, and acoustic pulse recognition.

The apparatus 10 can in some embodiments be capable of implementing the processing techniques at least partially in hardware, in other words the processing carried out by the processor 15 may be implemented at least partially in hardware without the need of software or firmware to operate the hardware.

The transceiver 13 in some embodiments enables communication with other electronic devices, for example in some embodiments via a wireless communication network.

The display 12 may comprise any suitable display technology. For example the display element can be located below the touch input module and project an image through the touch input module to be viewed by the user. The display 12 can employ any suitable display technology such as liquid crystal display (LCD), light emitting diodes (LED), organic light emitting diodes (OLED), plasma display cells, Field emission display (FED), surface-conduction electron-emitter displays (SED), and Electophoretic displays (also known as electronic paper, e-paper or electronic ink displays). In some embodiments the display 12 employs one of the display technologies projected using a light guide to the display window. As described herein the display 12 in some embodiments can be implemented as a physical fixed display. For example the display can be a physical decal or transfer on the front window. In some other embodiments the display can be located on a physically different level from the rest of the surface, such a raised or recessed marking on the front window. In some other embodiments the display can be a printed layer illuminated by a light guide under the front window.

Figure 2:
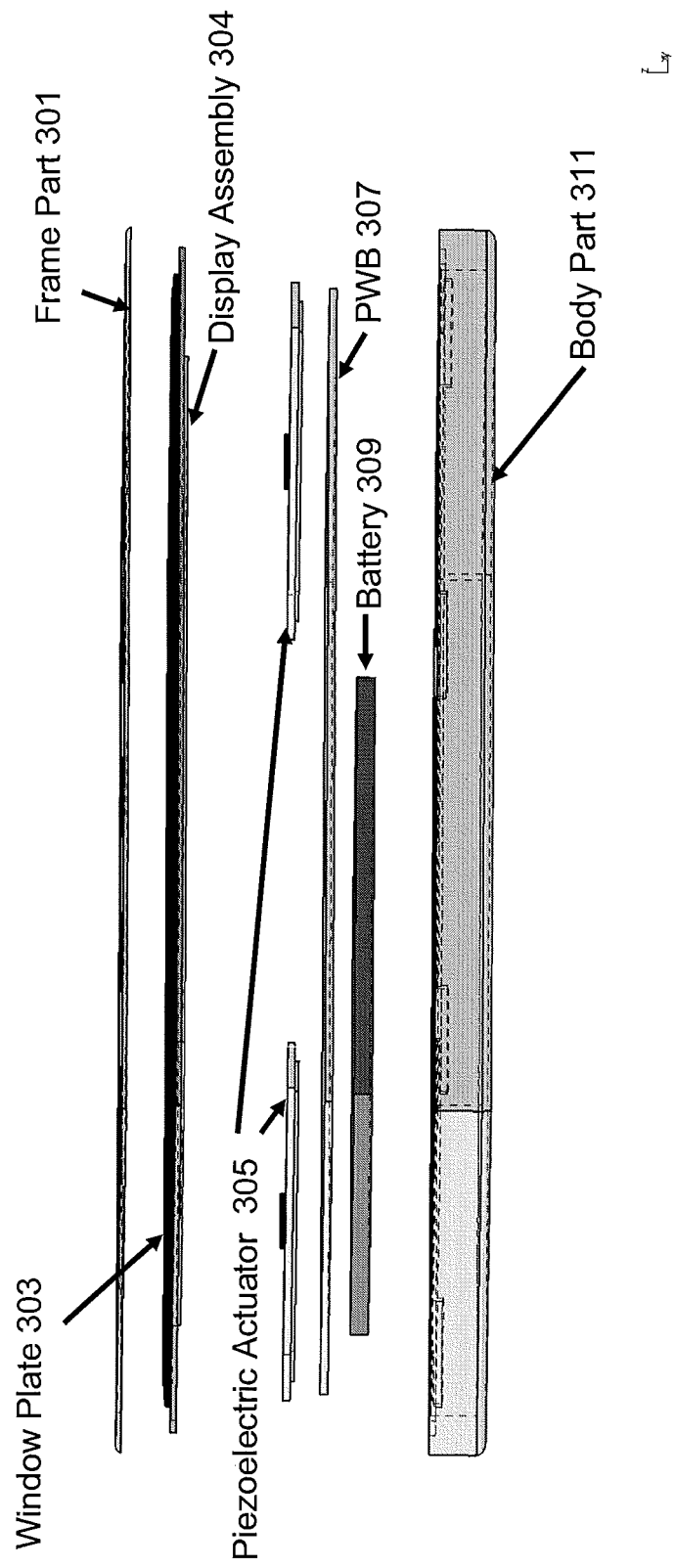
FIG. 2 shows a schematic exploded elevation view of example topology for apparatus according to some embodiments.
Figure 3:
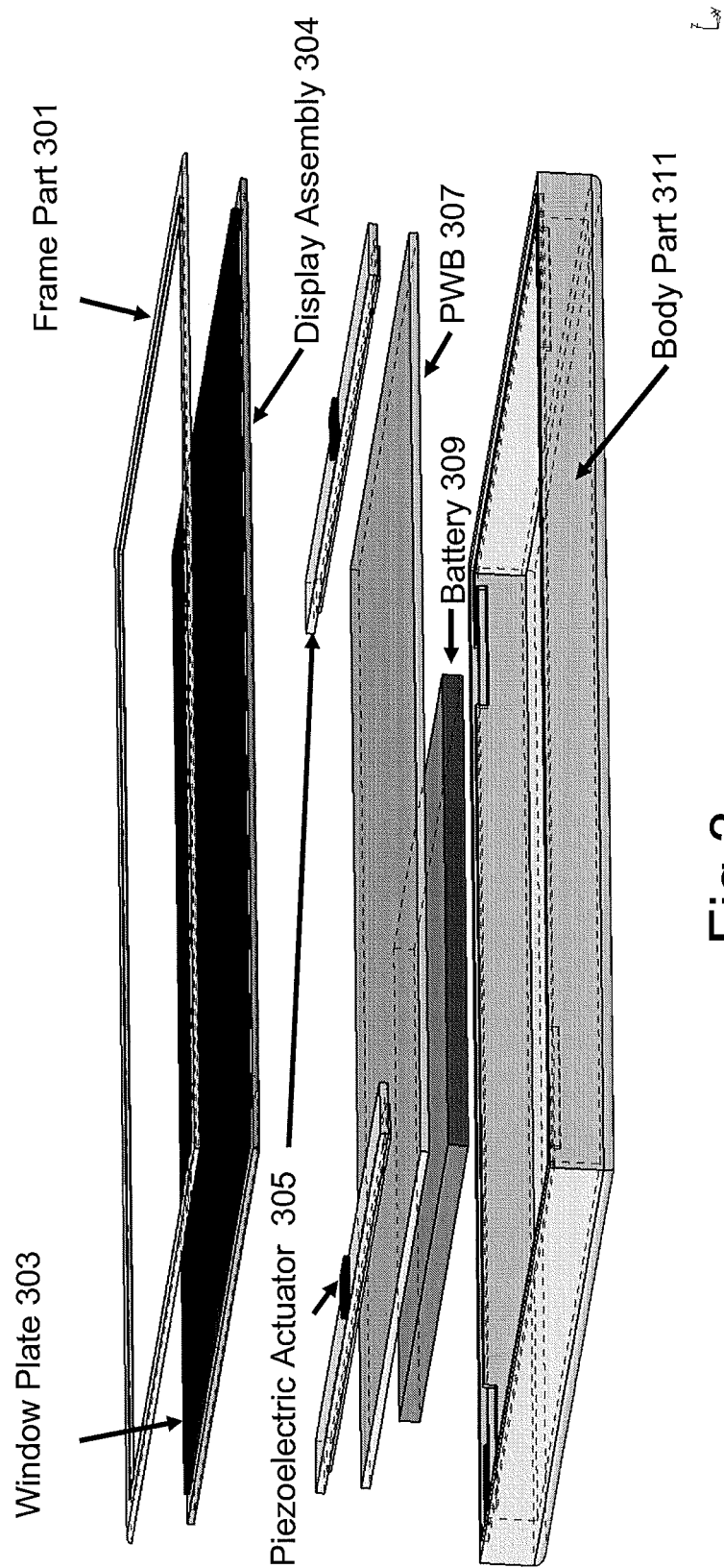
FIG. 3 shows a schematic exploded orthogonal projection view of the example topology for apparatus according to some embodiments in further detail.

With respect to FIGS. 2 and 3 exploded views of an example apparatus or device according to some embodiments of the application are shown. Furthermore with respect to FIG. 4 an assembled view of the example apparatus is shown. The apparatus 10 can comprise a body part 311 or outer frame which can be constructed from any suitable material and is configured to provide a structure to which other components may be coupled and/or may protect other components from damage. In other words at least one embodiment may comprise first structure means for forming at least part of the case of the apparatus. The first structure means in some embodiments thus can comprise: a body part; and a frame part, the method may further comprise at least partially framing the second structure means with the frame part. In some embodiments the body part 311 can comprise an inner surface to which internal components are located and an outer surface to which external components are located and which is exposed to the elements. In some embodiments the junction between the inner surface and the outer surface is connected via a filet or chamfer to smooth the junction. In such embodiments by smoothing the junction there is less chance of damaging other components.

The apparatus 10 in some embodiments comprises a battery 309. The battery 309 can be any suitable electrical power generating means and can employ any suitable electrical charge storage or generating technology, for example but not exclusively lithium polymer cells, fuel cell, solar cell or a combination of suitable technologies. In some embodiments the battery 309 is rechargeable or refillable and is connected via a port in the body part 311 to be able to receive a recharging or refilling coupling, for example a recharger plug to couple to a recharging socket for supplying power to recharge the battery 309. In some embodiments the battery 309 is configured to be located within the body part 311. For example the body part 311 can in some embodiments employs moulding tabs or other locating means on the inner surface to fix or locate the battery in position.

In some embodiments the apparatus 10 further employs a printed wiring board (PWB) 307. The printed wiring board 307 is configured to provide a suitable structure for locating electrical components. For example in some embodiments the processor 15, transceiver 13 and memory 16 shown in FIG. 1 can be located on the printed wiring board. In some embodiments there can be employed more than one printed wiring board 307 layer. Furthermore in some embodiments the printed wiring board 307 can be replaced by a printed circuit board (PCB) or surface mounted board suitable for locating surface mounted electrical components on it. In some embodiments the printed wiring board 307 is configured to be coupled to the battery 309 whereby the battery 309 is configured to supply the printed wiring board 307 with power to operate the electrical components located on it. In the example shown in FIGS. 2 to 4 the printed wiring board is located over the battery and within the body part 311. It would be understood that in some embodiments the body part 311 can employ moulding tabs or other locating means on the inner surface to fix or locate the printed wiring board in position.

The apparatus 10 further comprises at least one piezoelectric actuator 305. In the example shown in FIG. 2 the apparatus employs a first piezoelectric actuator 305 located towards one end of body part 311 and a second piezoelectric actuator 305 located at the opposite end of the body part 311. The piezoelectric actuator 305 is in some embodiments coupled to receive power from the battery 309 via the printed wiring board 307 and to produce a physical moment or force in response to a current passed through the piezoelectric actuator 305. In other words in some embodiments there is an actuating means for applying a force to the second structure means part to generate a displacement of the second structure means relative to the first structure means suitable for generating an audio signal.

Figure 4:
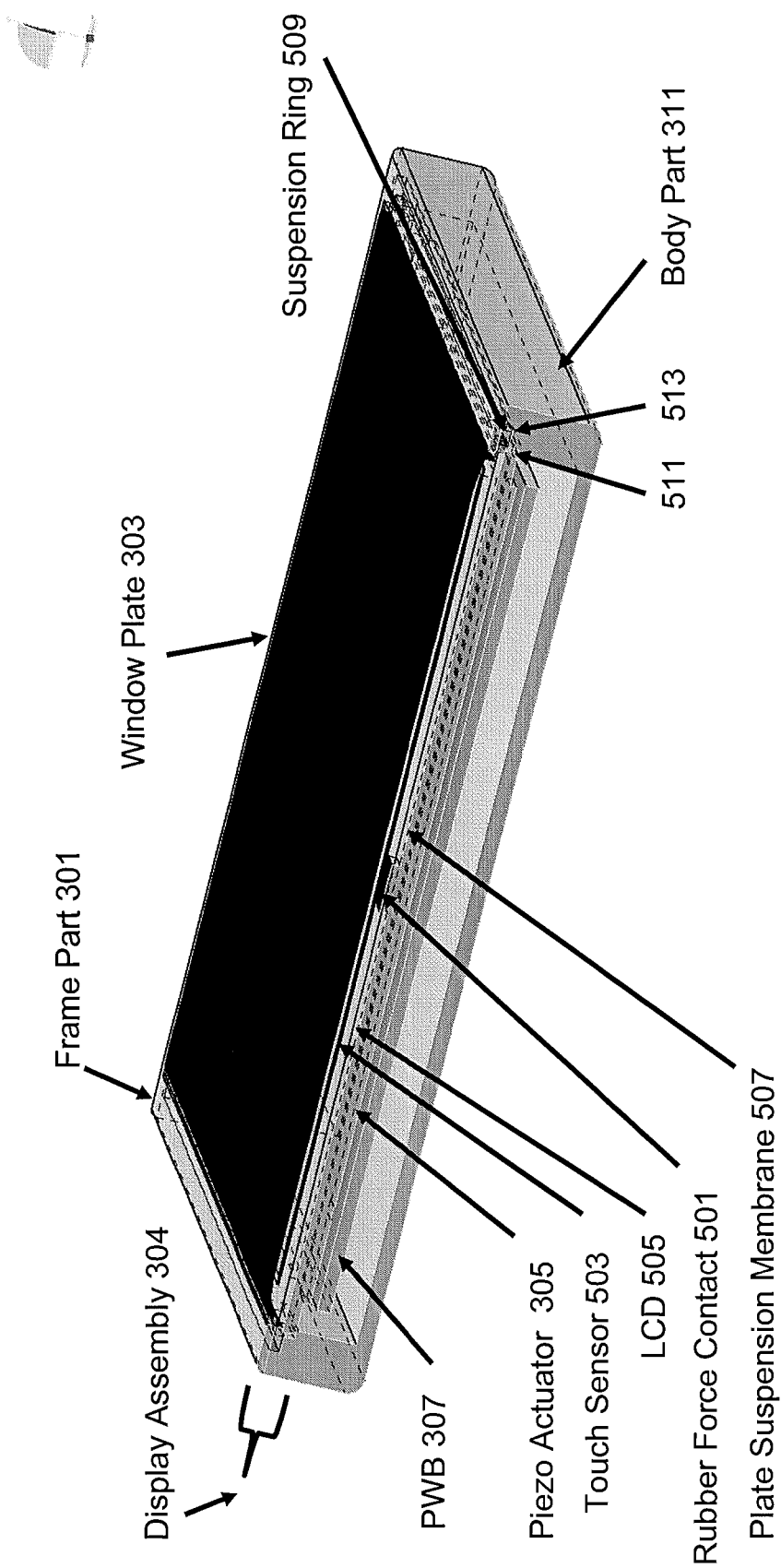
FIG. 4 shows a schematic orthogonal projection sectioned view of the example topology for apparatus according to some embodiments.

Each piezoelectric actuator 305 furthermore as can be seen in FIG. 4 can in some embodiments be located within the case body by an inner recess 511 which is configured to receive the piezoelectric actuator 305. The inner recess 511 is configured to locate either end of the piezoelectric actuator 305 in position such that in some embodiments when the piezoelectric actuator 305 is operated the ends of the piezoelectric actuator are fixed nodes. Furthermore as shown in FIG. 4 the piezoelectric actuator 305 in some embodiments is suspended at each end by the body part 311 recess 511 such that when a current is applied the piezoelectric actuator 305 flexes and can 'push' against the case body thus producing a motion in and away from the direction of the display. In other words where the display is considered to be in a plane designated the X-Y axis the actuations of the piezoelectric actuator to actuate or produce a force in a "Z" dimension or direction. In some embodiments there is configured to be a suitable air gap between the piezoelectric actuator 305 and the printed wiring board 307 in order to prevent 'clipping' of the actuation of the piezoelectric actuator 305.

Although the following examples are described with respect to the use of a piezoelectric actuator 305 it would be understood that any suitable actuator capable of producing a translational force to a display could be implemented in some further embodiments. For example in some other embodiments an eccentric mass can be employed to produce a force which may be passed. In further examples a moving coil or moving magnet actuator can generate the force.

In some further embodiments the display can directly experience the force which is transmitted from the piezoelectric actuator to the display assembly 304 in such a manner to permit a planar motion of the display assembly. For example in some embodiments the piezoelectric actuator is shaped with a suitable thickening to in a central portion to provide a projection through which force can be passed to a display.

In some embodiments the piezoelectric actuator 305 is further coupled via a conductive soft surface mounted technology (SMT) pad 219 to the printed wiring board (PWB) which provides an electrical coupling between the piezoelectric actuator 305 and the printed wiring board 307.

The apparatus 10 can in some embodiments comprise a rubber force contact 501. The rubber force contact is configured to be located on or be in contact with the piezoelectric actuator 305 approximately half way along the length of the actuator and translate the bending motion of the piezoelectric actuator to produce a linear or planar movement of a display assembly. In such embodiments the rubber force contact 501 can be manufactured from any suitable material, such as natural rubber, synthetic rubber, or plastic being capable of transmission of force in a direction. In some embodiments the rubber force contact 501 can be designed to provide a degree of buffering of force or 'damping' between the piezoelectric actuator 305 and the display so to prevent the display experiencing shock and/or damage when the piezoelectric actuator 305 is driven. The rubber force contact 501 or other force damping means furthermore can in some embodiments by damping the force furthermore reduce any bending moment experienced by the display. In other word at least one embodiment comprises coupling means for coupling the first structure means to the second structure means. The coupling means in such embodiments can comprise an elastic material affixing the first structure means and the second structure means. The elastic material as described herein can be at least one of silicone, thermoplastic elastomer (TPE); thermoplastic polyurethane (TPU); and rubber. In such embodiments the coupling means can affix the elastic material between the frame part and an associated section of the second structure means. The coupling means can furthermore in some embodiments further produce a substantially continuous interface between the first structure means and the second structure means.

The apparatus 10 can in some embodiments further comprise a display 304 or display assembly. The display 304 can comprise any suitable display technology as described herein. Therefore in some embodiments there can comprise a second structure means for forming at least part of the display for the apparatus. The second structure means can in some embodiments comprise: a front window layer; at least one display layer; and at least one touch interface layer.

In some embodiments the display 304 is configured to employ a flexible membrane or plate suspension membrane 507. The example shown in FIG. 4 shows the flexible membrane being located in contact or substantially in contact with the rubber force contact and suspended at least partially at a periphery of the flexible membrane 507 between the frame part 301 and body part 311. In some embodiments as shown in FIG. 4 the flexible membrane 507 is sandwiched at the periphery of the membrane between the body part 311 and the frame part 301 and located by a suspension ring 509 attached to the flexible membrane 507 and located within a suspension ring recess 513 formed on the inner surface of the body part 311. In some embodiments the suspension ring 509 can be formed as a substantially thickened section of the flexible membrane 507.

In some embodiments the inner surface of the body part 311 can be attached to the flexible membrane 507 via an adhesive layer. In some embodiments the adhesive layer extends beyond the static area of contact between the inner surface of the body part 311 and the flexible membrane 507 in order to provide additional protection at any dynamic area of contact between the inner surface of the body part 311 and the flexible membrane 507. The flexible membrane 507 in some embodiments may be manufactured from an elastomer. The elastomer in some embodiments may be any suitable film or foil. For example the suitable film or foil may be in various embodiments a polyethylene terephthalate (PET) film, a polycarbonate (PC) foil, or a silicone foil.

The flexible membrane 507 in such embodiments can furthermore be attached via a further adhesive layer to a surface of the frame part 301. The body part 311 and the frame part 301 thus in these embodiments locates at least some of the flexible membrane 211. In some embodiments the junction between the surfaces of body part 311 and the frame part 301 are configured with a fillet or chamfer to smooth the junction for a similar reason as above for protecting the membrane while the membrane is dynamic. Similarly in some embodiments the further adhesive layer may extend beyond the static area of contact to provide additional protection at any dynamic area of contact.

The flexible membrane 507 can be constructed out of polyethylene terephthalate (PET) polyester film. In some embodiments the film can be biaxially oriented polyethylene terephthalate which may be used because of its high tensile strength, chemical and dimensional stability, transparency and also electrical insulation properties. The PET flexible membrane layer can in some embodiments be approximately 0.01 to approximately 1 mm thick as this thickness has been shown to provide both the flexibility in response to forces from the user and from the actuator but also has sufficient tensile strength not to break under such forces. The PET flexible membrane 211 can be constructed by any suitable means. For example the PET layer may be constructed by extrusion onto a chill roll which quenches it into an amorphous state. The PET flexible membrane layer furthermore in some embodiments can be constructed in such a way that the crystallites grow rapidly but reach the boundary of neighbouring crystallites and remain smaller than the wavelength of visible light and thus produce a film having excellent clarity.

In some embodiments the display assembly can further comprise a display element 505. The display element 505 can in some embodiments comprise a static display array located beneath the front window 303 and projected up to the user through the front window 303.

The graphic layer can comprise any suitable material for blocking projected light. In such embodiments the graphic layer can be approximately 0.05 to approximately 0.07 mm thick. Furthermore in some embodiments the graphic layer can be printed directly onto the underside of the front window 303. In some other embodiments, for example where the display element 505 is a dynamic display, the graphic layer can comprise any suitable material for permitting the controllable and selectable projection of light—for example a liquid crystal display element and colour filter layer, E-ink etc.

The graphic layer can in some embodiments be coupled to the flexible membrane 507 via an optically clear adhesive (OCA) layer. The optically clear adhesive layer can be approximately 0.025 to approximately 0.05 mm thick and can be the same material as other OCA layers.

The static display array in some embodiments can also comprise a graphic layer which may be connected to the front window 303 by a first optically clear adhesive (OCA) layer. The first optically clear adhesive layer may be approximately 0.025 to approximately 0.05 mm thick and be any suitable OCA material.

The display assembly 304 in some embodiments further comprises a touch sensor 503 for example a capacitive touch sensor located over the display element 503.

The capacitive touch sensor can in some embodiments comprise a series of layers. The layers in the capacitive touch sensor can comprise at least one Indium Tin Oxide on PET layer, and a protective hard coated PET layer. Each layer can in some embodiments be fixed to the neighbouring layers by the use of an optically clear adhesive to form a sandwich of layers.

The display element 505 for example can in some embodiments be connected via a second layer of optically clear adhesive (OCA) to a first layer of indium tin oxide (ITO) on PET. The second layer of OCA can in some embodiments be approximately 0.025 to approximately 0.05 mm thick.

The first layer of indium tin oxide (ITO) on PET in some embodiments is the first of the capacitive touch interface 203 layers. In other words the first ITO on PET layer provides a first layer capable of detecting the capacitive coupling produced by the user's finger when it touches the front window 303. The first layer of ITO on PET can in some embodiments be approximately 0.05 to 0.2 mm thick.

The first layer of ITO on PET layer can be connected to a second ITO on PET layer via a third layer of optically clear adhesive (OCA). The third layer of OCA can in some embodiments be approximately 0.025 to approximately 0.05 millimetres thick.

The second layer of ITO on PET can in some embodiments be a further layer capable of detecting the capacitive coupling produced by the user's finger when it touches the front window 303. The second ITO on PET layer can in some embodiments be approximately 0.05 to approximately 0.2 mm thick.

Although the capacitive touch interface layers have been described as being ITO on PET layers it would be understood that the capacitive touch interface layers may comprise any suitable material, for example ITO on glass.

In some embodiments the display comprises a protective or front window 303.

The front window 303 can in some embodiments be manufactured from glass. In some embodiments the glass may be coated with optical (to reduce glare) or oleophobic (to resist fingerprints) films to enhance the characteristics of the front window. The front window 303 can in some embodiments overlay the other display components and is configured to protect the other display components. In such embodiments, the front window 303 made from glass can be approximately 0.5 to approximately 1.2 millimetres thick.

In some other embodiments the front window 303 can be manufactured from a plastic or other protective screen material suitable for both enabling the other components from performing their tasks and protecting the other components from physical or other damage. For example the front window 303 can in some embodiments provide a dielectric material between a capacitive touch interface touch sensor 503 and the user's finger, while the front window 303 is also sufficiently transparent to permit any display elements under the window being seen by the user.

The front window 303 for example as shown in FIG. 4 covers the touch sensor 503 and in some embodiments can be connected by a further layer of optically clear adhesive.

Although the above example is shown where the touch sensor 501 covers the display element 503 which lies on the flexible membrane layer 507 it would be understood that the layers could be reordered into any suitable arrangement.

Furthermore in some embodiments the display element 505 can employ further layers such as a light guide layer for projecting a light towards the user. The light guide layer can be formed from any suitable material for conveying a light from a light source (not shown) and projecting the light to the user. In some embodiments the light guide can diffuse the light to produce a more pleasing display image.

Furthermore in some embodiments the display element can employ a hard coated PET layer which can provide both support for and protect the display and/or flexible membrane from physical damage.

In some other embodiments the display element 505 is not a filtering display where a uniform (or generally uniform) light source is filtered to produce an image but may be a generated display such as an light emitting diode (LED) or active matrix organic light emitting diode (AMOLED) display.

In some embodiments the flexible membrane layer 507 can be manufactured as one of the other above described PET films. For example the flexible PET membrane may be an extension of one of the ITO on PET layers extended beyond the shape of the touch sensor to enable it to be fixed to the case. In such embodiments the ITO on PET layer may thus be both the flexible membrane and be sensitive to capacitive changes.

Although the above examples feature the flexible membrane as a PET layer it would be understood that any suitable material may be employed. For example in some embodiments the flexible membrane may be formed by a polycarbonate layer. In such embodiments a thickness of approximately 0.1 mm polycarbonate may provide sufficient tensile strength and flexibility.

The flexible membrane 507 can be in some embodiments considered to be a laminar film or layer which is located at least at some contact area to an inner part comprising at least one of the window, touch sensor and display element and at least at some other contact area to the outer part comprising at least one of the frame or body part. The flexible membrane 507 furthermore in these embodiments maintains a flexible connection between the inner part and the outer part. In other words the flexible membrane 507 is configured in these embodiments to be flexible in that it is elastic in nature such that when pressure is applied to the front window 303 the flexible membrane 507 can move or flex relative to the frame or body part and thus the inner part can move relative to the outer part.

Furthermore the flexible membrane layer 507 in such embodiments can permit without undue damping the transmission of force generated by a piezoelectric actuator 305 such as a force of 1 to 2 N to the display assembly 304 can be sensed by the user.

Furthermore the flexible membrane 507 together with the rubber force contact 501 in some embodiments can further limit the motion of the inner part relative to the outer or peripheral part. The flexible membrane 507 and the rubber force contact 501 may therefore prevent the inner part 251 from 'hovering'. Hovering is an effect experienced by a user where when the inner and outer parts can move laterally as well as vertically with respect to each other. This for example is found in systems where gaskets wear or are loose and thus produce a slipping, tipping or rolling motion of the inner part relative to the peripheral part. This effect is especially noticeable in large touch interfaces and touch screen displays. This hovering may not only be unpleasant to interact with as the button press feels broken, but may vibrate and generate a buzzing or noise which would lead the user to think that the product was faulty or sub-standard. The flexible membrane 507 in some embodiments thus may generate no or only negligible damping force on the inner part nor transmit any or only negligible force to the case through the membrane to limit any case vibration.

The flexible membrane 507 is preferably light and does not therefore produce significantly more undamped weight in addition to the mass of the suspended display assembly to be moved by the piezoelectric actuator 305. In some embodiments the elasticity or flexibility of the flexible membrane 507 is such that it enables a vertical or sheer displacement of the display assembly with respect to the body part 311/frame part 301 such that the user experiences a response similar to that of pressing a physical key or button.

In some embodiments the piezoelectric actuator 305 can be modulated in such a way that the modulation transmitted via the flexible membrane laminar to the display 304 causes the display 304 to generate audible oscillations. In other words in some embodiments the display can be used as a flat panel speaker structure where the flexible membrane 305 provides sufficient damping (but not under-damping or over-damping) in the transmission of the piezoelectric actuated vibration to the display 304.

In some further embodiments, the flexible membrane 507 is applied across the apparatus extending to thus provide a dust and moisture proof seal protecting the delicate electronic circuitry and mechanical components from water, dust, or other materials.

Furthermore the apparatus 10 comprises a frame part 301 configured to locate the display assembly 304 in relation to the body part 311 as described herein.

Figure 5:
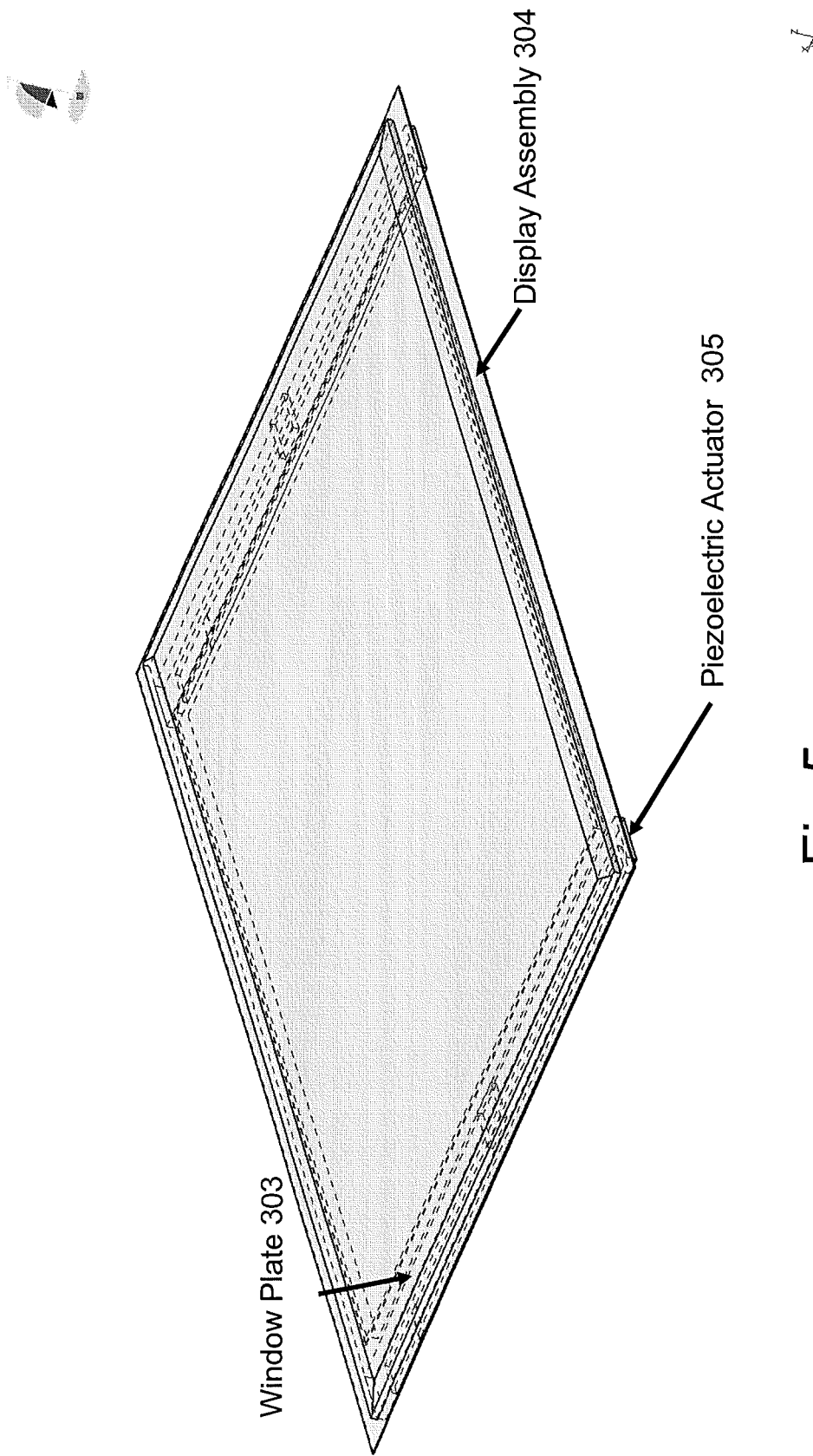
FIG. 5 shows a schematic isometric projection view of parts of the example topology in further detail.
Figure 6:
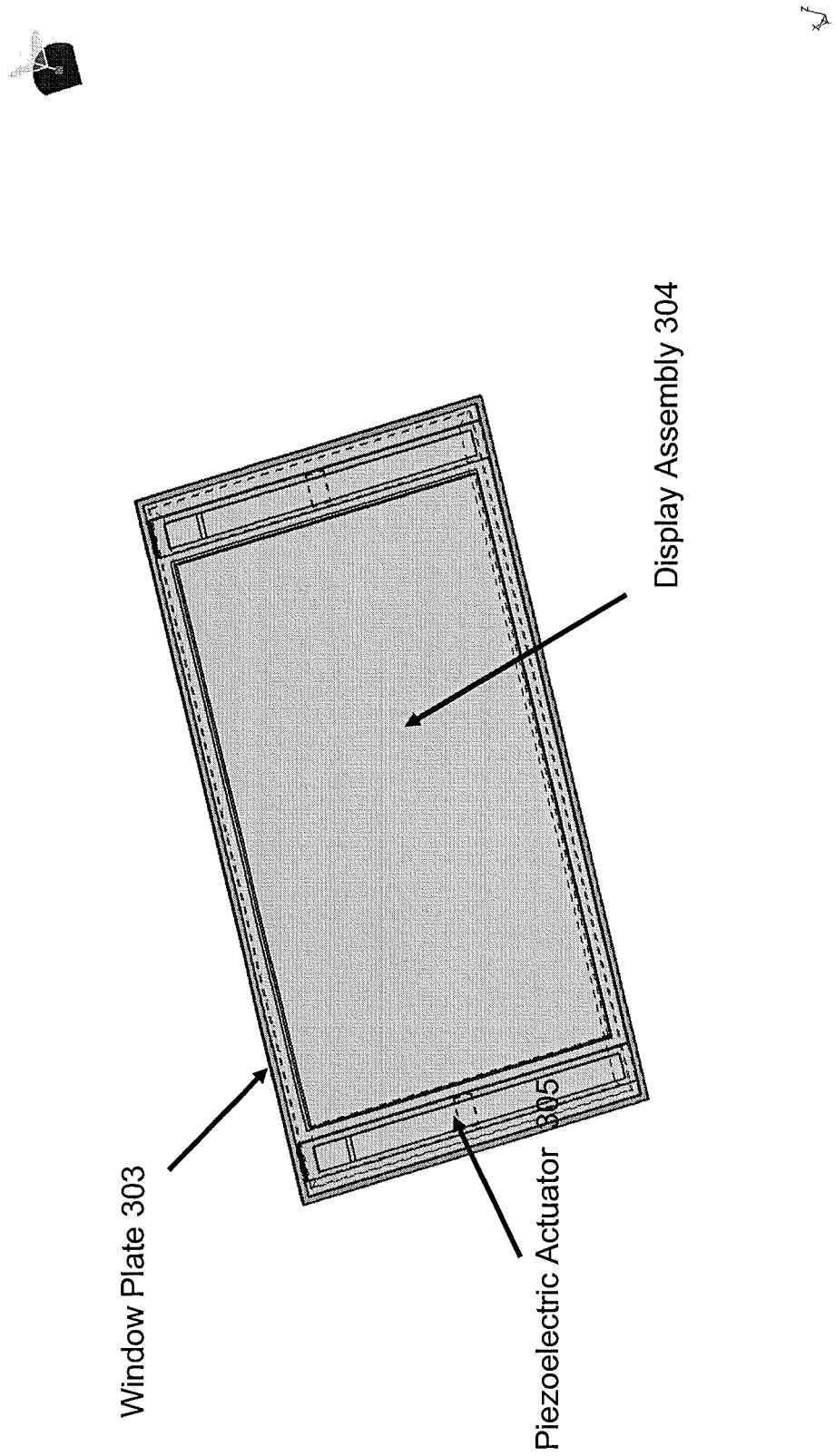
FIG. 6 shows a further schematic isometric projection view of parts of the example topology in further detail.

With respect to FIGS. 5 and 6, examples of display assemblies 304 are shown with a series of example dimensions. In the example shown in FIG. 5, the front window 303 is smaller than the display assembly 304 (which would in this example include the flexible membrane and suspension ring) such that the display assembly flexible membrane can be located between the frame part 301 and the body part 311. The example shown in FIG. 5 has a front window 303 approximately 110 mm long 54 mm wide and with an approximate thickness or depth of 0.565 mm. The front window 303 in such embodiments lies over or is in contact with the display assembly 304 which can be seen to be 2 mm longer in each direction and 0.6 mm wider in each direction. In such embodiments the piezoelectric actuator 305 are configured to be in contact with the display assembly via for example the rubber force contacts 501.

With respect to FIG. 6 the reverse side of a further example display module is shown whereby the display module or assembly 304 (which in this example does not include the show the flexible membrane and suspension ring but only the display layer) is smaller than the front window 303 and the front window 303 is in contact with the piezoelectric actuator 305 therefore reducing the direct stresses on the display assembly 304. The example shown in FIG. 4 displays a display assembly 304 as being approximately 58 mm wide and 114 mm long. Furthermore the piezoelectric actuator 305 is shown and are each 55 mm long and 6 mm wide located at opposite ends of the display module whereby the centre of the long axis of each actuator is approximately located on the centre of the short axis for the display assembly 304. Furthermore the front window 303 can be seen approximately 91.2 mm long and 50.4 mm wide located centrally on the display assembly.

Figure 7:
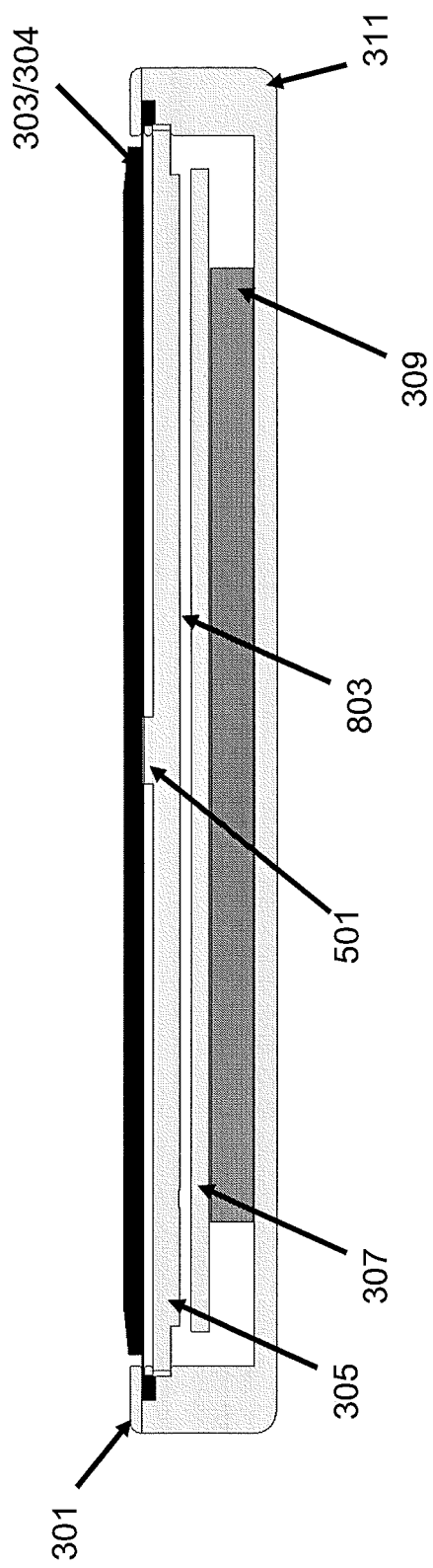
FIG. 7 shows a further schematic sectioned view of the example topology for apparatus according to some embodiments.
Figure 8:
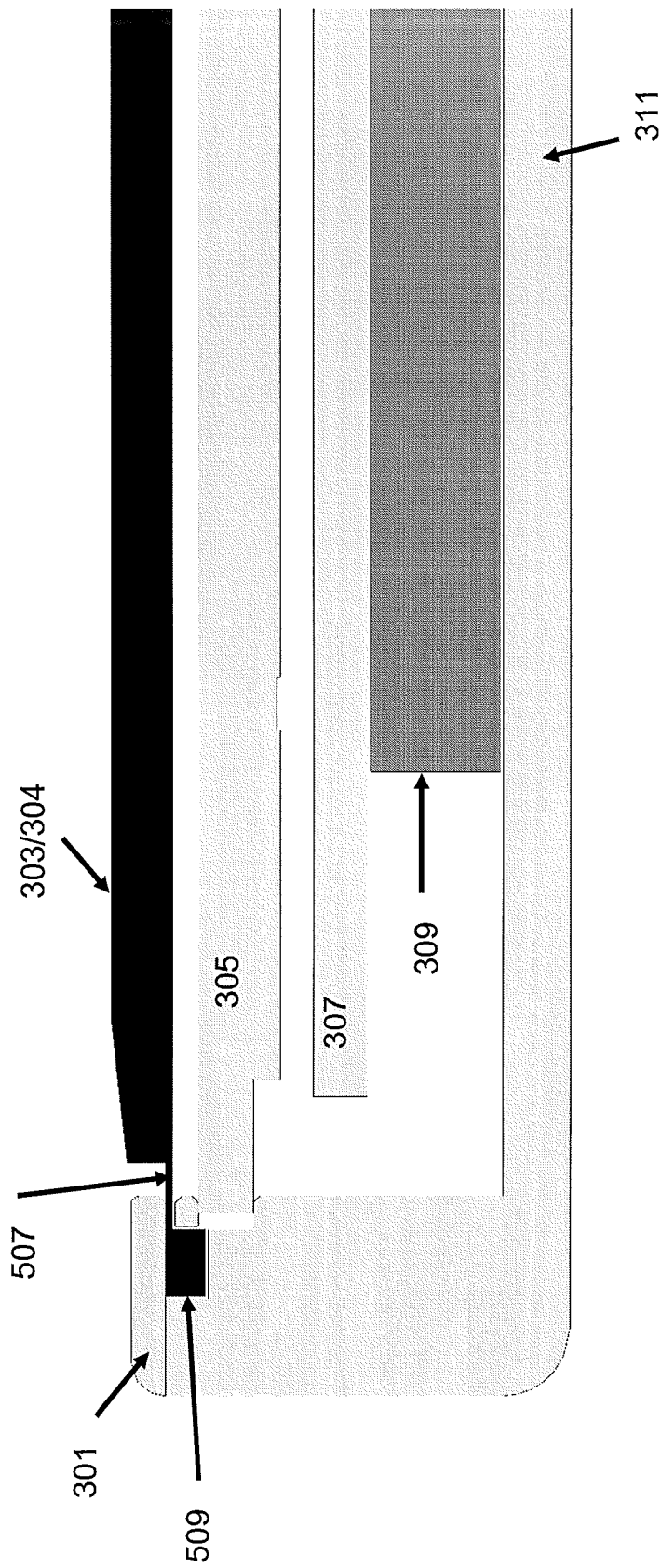
FIG. 8 shows a detail of the further schematic sectioned view of the example topology shown in FIG. 7.

With respect to FIG. 7, a sectioned view of the end of the apparatus 10 according to some embodiments where the display assembly 304 is physically larger than the front window 303 and the piezoelectric actuator 305 is coupled to the display assembly via the rubber force contact 501 is shown in further detail. With respect to FIG. 8 a detail of the sectioned view shown in FIG. 7 is shown in order to show a possible way to locate the display assembly 304 with respect to the body part 311 and the frame part 301 by the use of a suspension ring 509 component. The detail shows the suspension ring 509 held or located in a recess formed between the frame part 301 and body part 311 which at one point is narrower than the cross-section of the suspension ring 509 permitting the coupling between the suspension ring 509 and the display assembly via the flexible membrane 507.

With respect to FIG. 9 a further view of an example configuration comprising two actuators 305 is shown in further detail. To simplify the figure only the frame part 301, body part 311, window plate 303/display assembly 304, actuators 305 and rubber force contacts 501 are shown. FIG. 9 can be seen to be a cross-section through the device in a plane perpendicular to the cross-section shown in FIG. 7. in other words FIG. 9 shows the window plate 303/display assembly 304 coupled to the first piezoelectric actuator through by a via a first rubber force contact 501*a* and further coupled to the second piezoelectric actuator 305*b* via a second rubber force contact 501*b*. As described herein, in some embodiments, the window plate 303/display assembly 304 is further located at least partially between the body part 311 and frame part 301.

In such embodiments the first piezoelectric actuator 305*a* can be configured to operate such that a force 1001*a* can be applied to the window plate 303/display assembly 304 at a position closer to one edge of the window plate 303/display assembly 304 and the second piezoelectric actuator 305*b* can be configured to apply a second force 1001*b* via the second rubber force contact 501*b* to the window plate 303/display assembly 304 at a position closer to the opposite edge of the window plate 303/display assembly 304. Furthermore the piezoelectric actuators 305*a* and 305*b* are configured in such embodiments to generate a force or motion or moment perpendicular to the plane described by or defined by the window plate 303/display assembly 304. However because the window plate 303/display assembly 304 is coupled between the body part 311 and frame part 301 at either edge of the window plate 303/display assembly 304 and the location of the these electric actuator 305 being off-centre and towards one or the opposite edges the motion of the window plate 303/display assembly 304 can be dependent on the relative force and position of the piezoelectric actuator 305 relative to the edge of the window plate 303/display assembly 304.

With respect to FIG. 10 an example of the motion of the window plate 303/display assembly 304 is shown when a symmetrical pairing of the piezoelectric actuators 305*a* and 305*b* are driven simultaneously or substantially in parallel. The force produced by the first piezoelectric actuator 305*a* is shown by the first force arrow 1001*a* and the force produced by the second piezoelectric actuator 305*b* is shown by the second force arrow 1001*b*. As can be seen when both of the piezoelectric actuators 305*a* and 305*b* are operating in parallel using substantially the same drive current to produce substantially the same magnitude force at substantially the same time the window plate 303/display assembly 304 moves in a plane substantially perpendicular to the plane described or defined by the window plate 303/display assembly 304. In other words the window plate 303/display assembly 304 moves in such a way that it is a substantially a linear translation in the dimension perpendicular into and out of the apparatus can (in other words the 'z' direction as compared to the 'x' and 'y' directions which define the display assembly). The movement of the window plate 303/display assembly 304 can be shown by the dashed lines 1101.

In such embodiments the displacement of the front window 303/display assembly 304 can be in the region of between 20 to 50 µm substantially perpendicular to the plane of the display assembly 304. In some embodiments the display assembly can be tuned provide a beneficial audio response. The display assembly 304 in such a mode of operation can produce a sufficient air displacement to generate audio signals with sufficient amplitude to implement speaker operations such as for example integrated hands free speaker operations. For example a reference requirement for all existing integrated hands-free speakers is 53 µm³ whereas the display shown in embodiments of the application can have a 56,000 µm² plate area which is multiplied by 50 µm peak to peak displacement to produce an air volume displacement of 280 µm³.

Furthermore as in some embodiments there are no magnetic parts required there are no issues concerning metal dust or other contaminants. Furthermore as the flexible membrane, frame part and body part can in some embodiments form a seal the whole system is easy to seal from moisture and dust as no sound holes are required and apparatus can be easily weatherproofed. Furthermore in some embodiments by using the display assembly as both display and air mass driver no internal audio transducers are required thus reducing the required volumes and space and allowing thinner and more aesthetically pleasing products to be designed.

With respect to FIG. 11 a further example of the operation of such embodiments of the application as described herein is described shown in further detail. In such an example the window plate 303/display assembly 304 is subject to the force or moment produced by only the second piezoelectric actuator 305*b* as shown by the force arrow 1001*b*. In such an example the motion of the window plate 303/display assembly 304 is such that the window plate 303/display assembly 304 effectively pivots about the point of sealing between the frame part 301 and the body part 311. The pivoting action is shown in FIG. 11 by the dashed lines 1201. As described herein the motion of the display can be configured to drive an air mass in order that it produces an acoustic signal. However in such embodiments the acoustic wave is generated such that the majority of the acoustic wave occurs around the area of the second piezoelectric actuator 305*b*.

Therefore the operation of the apparatus using one from a multiple piezoelectric actuator configuration can in some embodiments generate audio signals with sufficient amplitude to implement earpiece operations such as for example hand portable speaker operations. In other words in at least one embodiment the actuating means can comprise at least two actuators configured to operate, in a first mode, the at least two actuators to generate a displacement of the second part relative to the first part substantially to the whole of the second part; The actuating means may comprise at least two actuators configured to operate in a second mode, a subgroup of the at least two actuators to generate a substantially localised displacement of the second part. Furthermore in operating, in a first mode, the at least two actuators generate a substantially translational displacement of the second part relative. Whereas operating, in a second mode, a sub-group of the at least two actuators generate a substantially localised displacement of the second part by generating a substantially rotational motion of the second part about a pivot defined by an interface between the first and second structure means.

Figure 12:
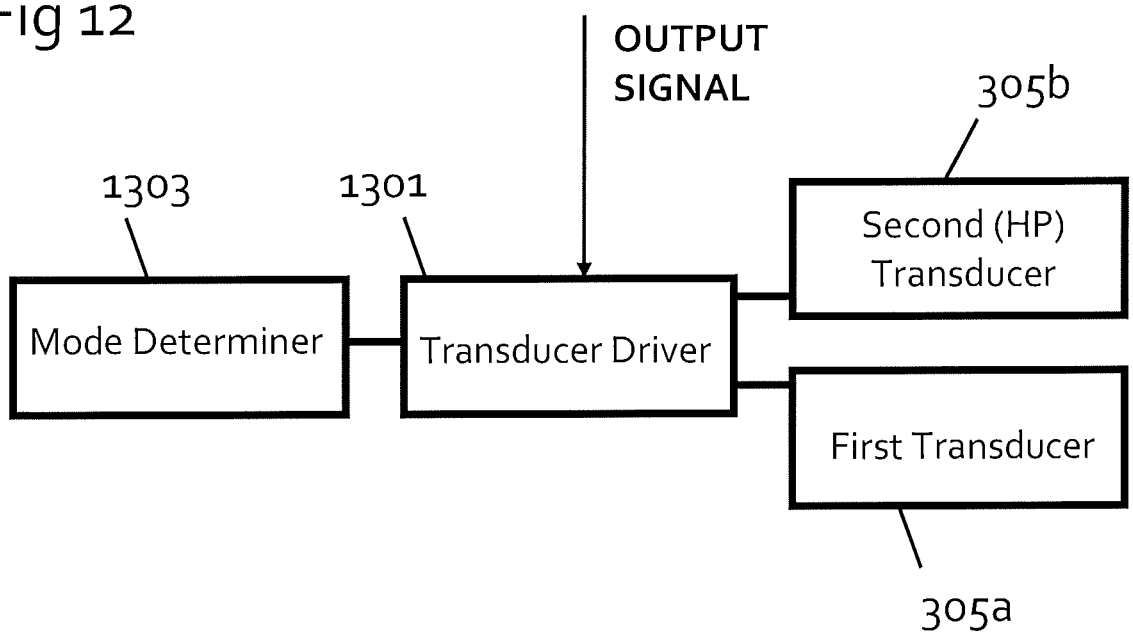
FIG. 12 shows a schematic view of the apparatus in further detail configured to operate the single or multiple actuator operation according to some embodiments of the application.
Figure 13:
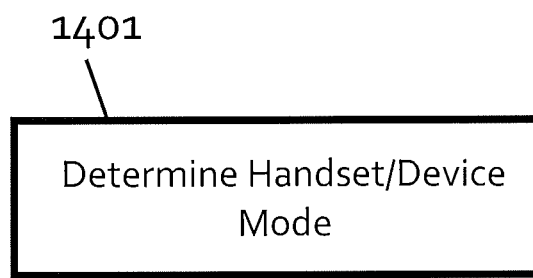
FIG. 13 shows a flow diagram of the operation of the apparatus shown in FIG. 12.

With respect to FIG. 12 and FIG. 13 the apparatus is shown in further detail with respect to the provision of operating the apparatus in at least one of a hands-free or hand portable mode of operation.

With respect to FIG. 12 the apparatus is shown comprising in some embodiments a transducer driver 1301 configured to receive an audio signal or output signal to be passed to the piezo-electric transducers 305a and 305b. Furthermore in some embodiments the transducer driver 1301 is configured to be coupled to a mode determiner 1303 and configured to receive a signal or indication from the mode determiner 1303. In some embodiments the transducer driver 1301 is further coupled to the second transducer 305b, which in some embodiments is the hands portable (HP) transducer furthermore in some embodiments the transducer driver 1301 is configured to be coupled to the first transducer 305a. The transducer driver 1301 is configured to receive the output signal and the mode determiner signal and drive or power at least one of the piezo-electric transducers in such a manner to permit a haptic response or generate an audio or acoustic signal. In other words the apparatus can in some embodiments comprise driving means for driving at least one of the at least two actuators dependent on a mode determination signal. Wherein the mode determination signal can itself comprise at least one of: a hands-free mode determination signal, wherein the driving may drive at least one of the at least two actuators dependent on a mode determination signal may comprise driving the at least two actuators; and a hands-portable mode determination signal, wherein the driving means may drive at least one of the at least two actuators dependent on a mode determination signal may comprise driving a sub-group of the at least two actuators to generate the substantially localised displacement.

The operation of such a system is described with respect to FIG. 13.

The mode determiner 1303 can in some embodiments be configured to determine a mode of operation of the device. For example the mode determiner 1303 when implemented in some embodiments in a handset or mobile device can be configured to determine whether the device is operating in a hands free mode or a hands portable mode. In other words whether or not the device is currently being held close to the head or 'hands portable' mode in which case the mode determiner 1303 can be configured in some embodiments to receive a signal from a photo-sensor or some other suitable sensor detecting whether or not an object is close to the device. It would be understood that an acoustic signal to be output to the user would not only be required to be at a lower volume or amplitude but could also required to be more 'directionally focussed' to prevent acoustic leakage to the environment and thus overheard by other parties. The mode determiner 1303 in such embodiments can pass or output an indicator associated with the device mode to the transducer driver 1301. The apparatus thus in at least one embodiment can further comprise determining means for determining the mode determination signal. The mode determination signal being determined dependent on at least one of: at least one proximity sensor; an apparatus orientation sensor; and an apparatus operating system setting.

The operation of determining the handset/device mode is shown in FIG. 13 by step 1401.

The transducer driver 1301 furthermore in some embodiments having received the output signal and the indicator from the mode determiner 1303 indicating the device mode can check the indicator and determine drive signals for the first and second piezo-electric transducers dependent on the mode of operation of the device.

The drive mode checking operation is shown in FIG. 13 by step 1403.

In some embodiments the transducer driver 1301 when determining that the device is being handled (in other words in hands portable mode) can be configured to drive the hands portable transducer (the second transducer) 305b only, thus producing a pivoting action on the display where the volume or acoustic amplitude is concentrated at the display edge moved by the second transducer. In such a manner a more directed audio signal which is suitable for close listening and does not produce an acoustic shock can be output to the user.

The operation of driving the hands portable transducer only is shown in FIG. 13 by step 1405.

The transducer driver 1301 furthermore in some embodiments can be configured to drive both (or more than one) of the piezo-electric transducers after receiving a signal indicating that the device is operating in a non-hands portable mode, such as for example an integrated hands free speaker mode. The transducer driver 1301 by being configured to drive more than one transducer can thus in such embodiments produce a greater volume of air displacement and increase the volume and amplitude of the output audio signal throughout the whole of the display movement.

As described herein in such embodiments, by generating a localised displacement of the display by operating only a sub-group of the actuators the apparatus and specifically can simulate an earpiece (or other localised) audio source and enable much more private conversations or listening experiences. This is because in operating all or significantly all of the actuators the audio signal generated is not a localised one which can be efficiently blocked by placing the apparatus close to the ear/head.

The operation of driving both of the transducers in order to operate the handset in a hands-free speaker mode is shown in FIG. 13 by step 1407.

Although the apparatus shown herein can be configured in some embodiments to operate in both hands-free and 'localized' or hand-portable mode of operation it would be appreciated that any suitable apparatus can similarly be operated in these modes of operation. For example as described herein the display may not be coupled to the frame using a thin membrane but instead by using an elastic coupling. Furthermore the display may be actuated in some embodiments by more than two actuators. In some other embodiments a series of actuator coupling means can be used to pass the force to the display. For example at least one actuator and a series of mechanical couplings can in some embodiments be controllable so to pass (or filter) the actuation forces to the display so to provide localized motion of the display for the hand-portable mode of operation.

Figure 14:
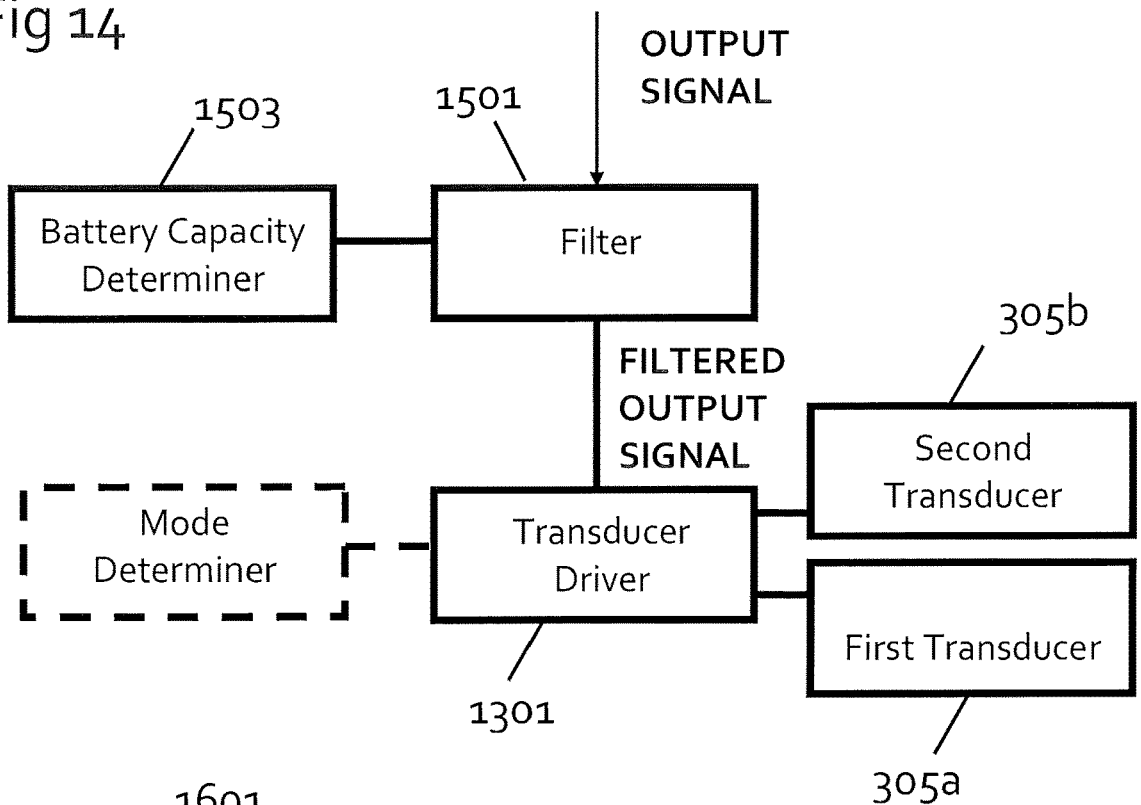
FIG. 14 shows the schematic view of the apparatus in further detail configured to operate the apparatus configured to operate the display in variable power mode operation according to some embodiments of the application.

With respect to FIG. 14 a further device configuration according to some embodiments of the application is shown whereby power consumption and battery capacity can be taken into account when driving the display. Although it is known that in order to reduce battery consumption the transducers can be adjusted or modified to only produce a low volume sound or low amplitude vibration this can be seen to produce poor quality output which is difficult to hear especially when the device is operated in a hands free configuration. The apparatus thus can further comprise controlling means for operating the at least one actuator dependent on at least one power characteristic of the apparatus. The actuator system shown in FIG. 14 can in some embodiments comprise a battery capacity determiner 1403. The battery capacity determiner 1403 can in some embodiments be coupled to the battery to determine at least one battery characteristic. A battery characteristic can be any suitable power parameter such as the maximum battery power capacity, current battery power capacity, whether the battery is being charged or discharged, current power drain on the battery, expected time to battery discharge. Although the above characteristics are representative of a rechargeable battery such as a lithium-ion cell battery, it would be understood that the following could be applied to any suitable electrical power generator or storage device such as but not exclusively, non-rechargable chemical battery systems, rechargeable chemical battery systems, capacitor charge storage systems, mechanical power storage systems, and chemical power generation systems such as fuel cell systems.

The battery capacity determiner 1403 in some embodiments can furthermore be coupled to a filter 1501. The filter 1501 can in some embodiments be configured to receive the output signal to be output to the user. The output signal in these embodiments as described herein is any suitably formatted signal for generating a movement of the display so to generate a haptic or acoustic response. The filter 1501 in some embodiments is an adjustable digital filter such as a suitable finite input impulse response (FIR) or infinite impulse response (IIR) digital filter. The coefficients of the filter can in some embodiments be determined based on the indicator or characteristic determined by the battery capacity determiner 1503. In some embodiments the filter can be a determined or fixed filter which is applied to the signal when the power characteristic is significant compared to a determined value. For example the filter could be applied when there is less than 10% of the battery capacity remaining in order to allow the user time to complete a call or process without undue haste. The controlling means may therefore in some embodiments comprise a filter for filtering a signal to operate the at least one actuator. The filter can in some embodiments comprise at least one of: a low pass filter; an equaliser filter; and a band pass filter. As discussed herein in some embodiments the controlling means selectively apply the filter when a power characteristic value is significant when compared to a threshold value or selectively adjust the filter performance dependent on a power characteristic value.

The filter 1501 furthermore in some embodiments can be coupled to the transducer driver 1301 and be configured to pass a form of the output signal.

The transducer driver 1301 is as described herein be configured to receive from the filter 1501 the output signal form. The transducer driver 1301 can in some embodiments be similar to the transducer driver described with respect to FIG. 12 and can in some embodiments further be coupled to a mode determiner for controlling the output of the transducer driver sent to at least one of the first or second transducers 305a, 305b.

Figure 15:
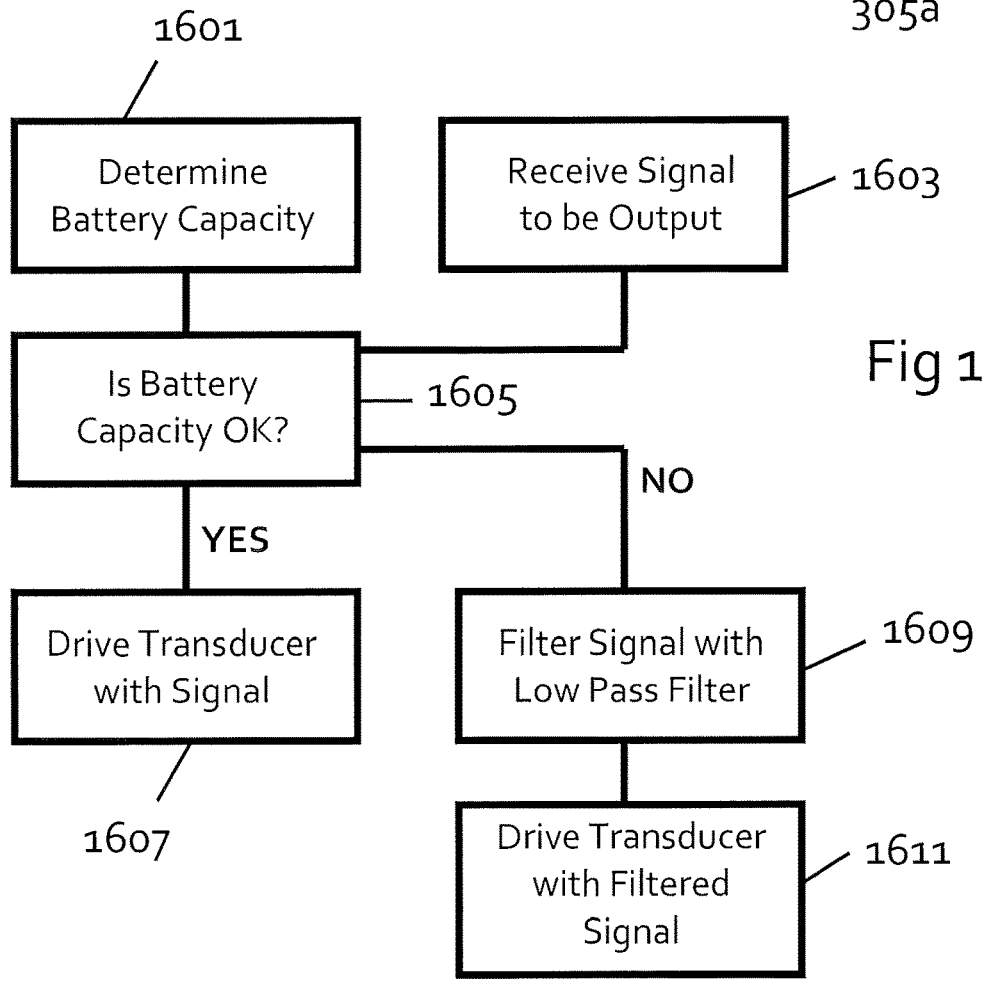
FIG. 15 shows a flow diagram of the operation of the apparatus shown in FIG. 14.

The operation of the actuator system shown in FIG. 14 in some embodiments can be shown with regards to the flow diagram shown in FIG. 15. The battery capacity determiner 1503 can therefore in some embodiments determine the battery capacity. As described herein the battery capacity determiner can in some embodiments be configured to determine any suitable parameter or characteristic of the power generator/storage device used in the device, of which the current battery capacity example is shown here.

The operation of determining the battery capacity is shown in FIG. 15 by step 1601.

Furthermore the filter 1501 can be configured to receive the signal to be output.

The operation of receiving the signal to be output is shown in FIG. 15 by step 1603.

The battery capacity determiner can furthermore determine whether or not the current battery capacity is acceptable or okay. In some embodiments the determination of the battery capacity acceptability is a threshold event in other words whether the battery capacity is either acceptable or not acceptable. In such embodiments the battery capacity determiner 1503 can perform a check of whether the battery capacity is acceptable by comparing the current capacity against a known capacity threshold value. In some embodiments this can be at least one of an absolute value (for example 200 mAh), a relative value (for example 10% of rated capacity), or a consumption dependent value (for example 10 mins of battery capacity remaining at current consumption).

The operation of performing the check whether the battery capacity is acceptable is shown in FIG. 15 by step 1605.

Where the battery capacity is acceptable the filter is configured to receive a signal to not apply a filtering to the output signal or where the filter is configured to be suitable to apply acoustical filtering a filtering only for acoustic preference signal processing purposes to tune the transducer output only. The transducer driver 1301 can in such embodiments be configured to receive the unfiltered or mildly filtered output signal and drive at least one of the first and second transducers 305a and 305b to produce the haptic and/or acoustic output.

Figure 16:
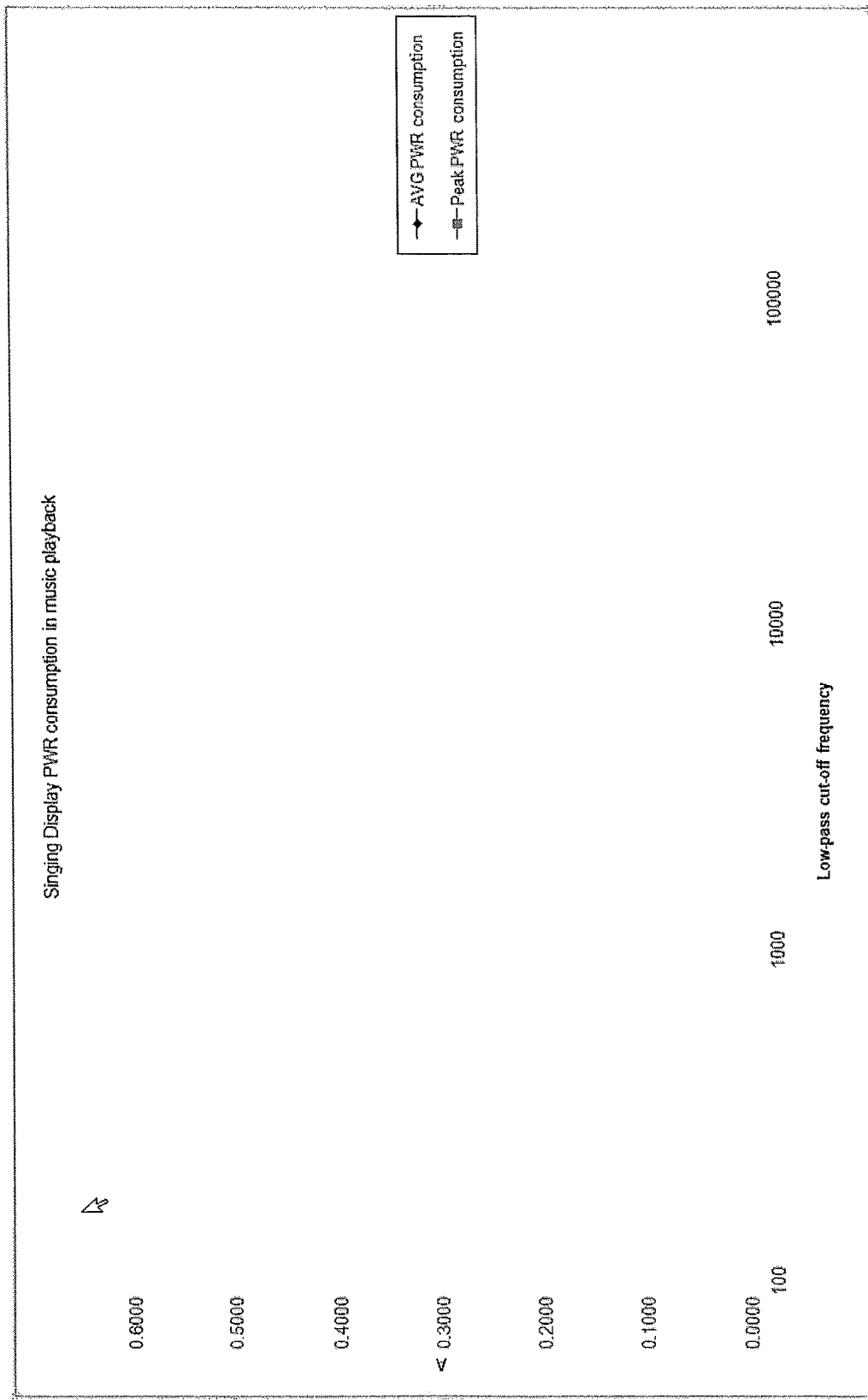
FIG. 16 shows a spectral response of an example filter applied in a low-power mode according to some embodiments of the application.

The operation of driving the transducer with the unfiltered or mildly filtered signal is shown in FIG. 15 by step 1607.

Where the battery capacity determiner 1503 determines that battery capacity is not currently acceptable the filter can be configured to receive an indicator or signal to apply a low pass filter to the output signal. An example of a low pass filter which could in some embodiments be applied to the output signal is shown in FIG. 16. The low pass filtered output signal can be passed then in such embodiments to the transducer driver 1301.

The operation of filtering the signal with the low pass filter is shown in FIG. 15 by step 1609.

Furthermore the transducer driver 1301 receiving the low pass filtered output signal can then drive at least one of the first and second transducers 305a, 305b with the suitable generated drive signal.

The operation of driving the transducers with low-pass filtered output signals is shown in FIG. 15 by step 1611.

It has been discovered that by applying a low pass filter with a cut off about 1 to 2 kHz that the power consumption can be reduced by approximately 50 to 70% over an unfiltered signal without significantly degrading the audio experience although the sound is said to be 'darker' as the upper frequencies are attenuated. However in such embodiments the user is still able to comprehend the output acoustic signal and the period between battery charges for the device can be significantly extended.

Although it has been discussed that the filter is a low pass filter any suitable filter which decreases the high frequency component of the signal relative to mid and low frequency components can be implemented in some embodiments.

Thus for example in some embodiments a band pass filter or equalizing filter design may be applied for removal of some of the higher frequency components to reduce power consumption by the actuator may be implemented.

Although we have discussed the acceptability of the battery capacity (or characteristic or parameter) being a threshold event it would be understood that in some embodiments the acceptability of the battery capacity (or any suitable characteristic or parameter) could be a continuously variable event. In such embodiments the filter can be configured to be a continuously adaptable filter. For example in some embodiments the effect or severity of the low pass filter can be changed as the battery capacity degrades in order to further preserve the battery life of the device.

Furthermore although we have discussed the embodiments of the application with regards to the battery capacity it would be understood that the battery capacity determiner 1503 can implement a determination of a temporary or short term parameter. In some embodiments therefore when temporary power consumption is very high such as during heavy data streaming or processing the audio power consumption can be lowered to prevent excessive battery drain during temporary periods.

Although the apparatus shown herein can be configured in some embodiments to operate in such ways it would be appreciated that any suitable apparatus can similarly be operated in these modes of operation. For example as described herein the display may not be coupled to the frame using a thin membrane but instead by using an elastic coupling. Furthermore the display may be actuated in some embodiments by more than or fewer than two actuators. In some other embodiments a series of actuator coupling means can be used to pass the force to the display.

Figure 17:
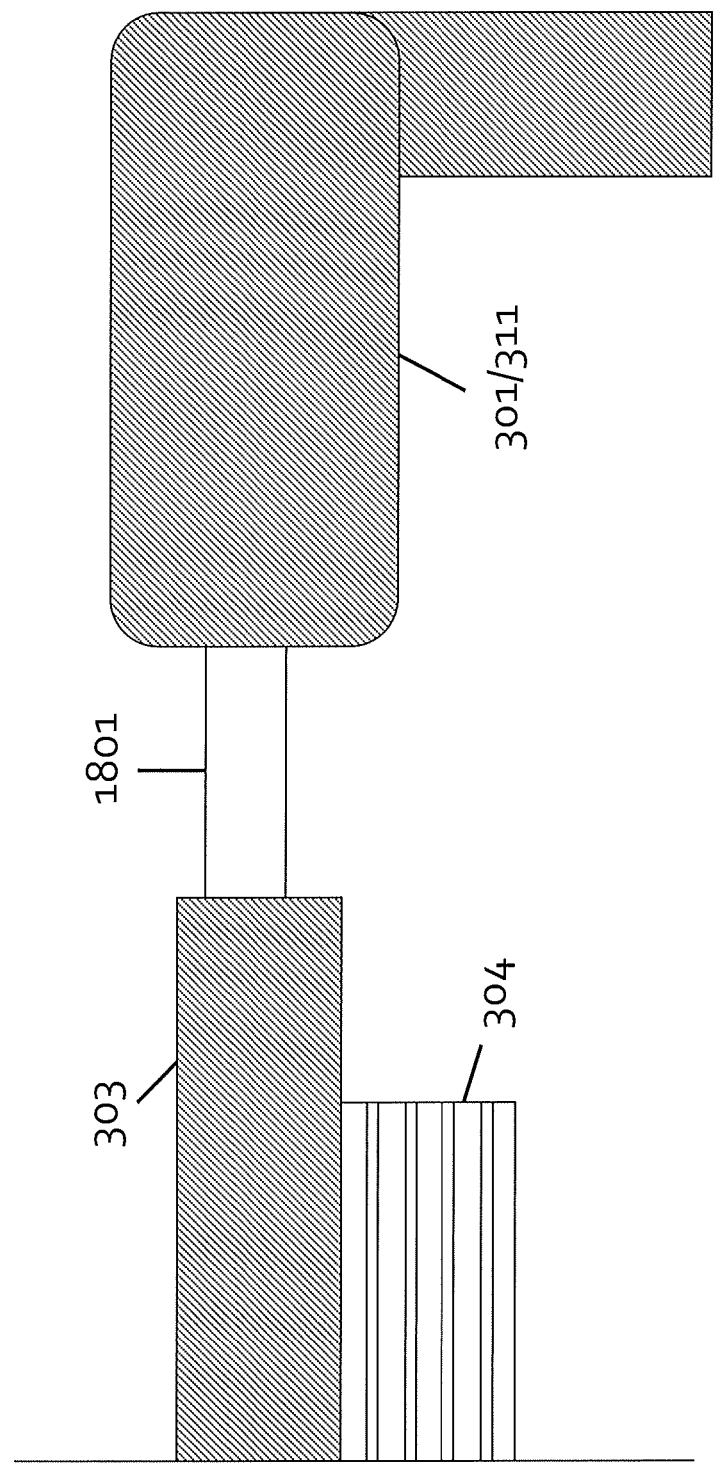
FIG. 17 shows a schematic view of the physical connection between the display part and the case or body part according to some embodiments of the application.

With respect to FIG. 17 a further embodiment of the application is shown wherein rather than the plate and display being suspended as discussed herein using a thin membrane from the case part the plate suspension is produced by an elastic material for example silicone which is located between the frame part and the plate part.

As shown in FIG. 17 the window plate 303 can be located with respect to the body part 311 and frame part 301 by a flexible or elastic material mass filling the 'gap' between the frame and plate part. In some embodiments the material can be distributed such that there is no or only a minor physical interface disruption between external surfaces forming the front plate front surface and the frame surface. The material between the front plate 303 and the frame part 301 is shown in FIG. 17 as a silicone layer 1801. The silicone layer 1801 can in some embodiments be located below the moving plate.

In such embodiments the flexible or elastic material mass 1801 provides better protection for the glass plate 303 and furthermore allows the production of a design which reduces the gap between the glass window plate and surrounding structures thus reducing the possibility of dirt or other contaminant build up. Although the elastic body in the above examples is constructed from a silicone material it would be understood that any suitable elastic material could be used in embodiments of the applications. Thus for example in some embodiments the elastic body material could be manufactured from a thermoplastic elastomer (TPE) based material; a thermoplastic polyurethane (TPU) based material; or a rubber based material (both natural and synthetic based).

It shall be appreciated that the term user equipment is intended to cover any suitable type of wireless user equipment, such as mobile telephones, portable data processing devices or portable web browsers. Furthermore, it will be understood that the term acoustic sound channels is intended to cover sound outlets, channels and cavities, and that such sound channels may be formed integrally with the transducer, or as part of the mechanical integration of the transducer with the device.

In general, the design of various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The design of embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory used in the design of embodiments of the application may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be designed by various components such as integrated circuit modules.

As used in this application, the term 'circuitry' refers to all of the following:
  (a) hardware-only circuit implementations (such as implementations in only analog and/or digital circuitry) and
  (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
  (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising:
    a first part configured to form at least part of a case of the apparatus;
    a second part configured to form at least part of a display for the apparatus;
    a coupling configured to couple the first part to the second part; and
    at least two actuators coupled to the second part and configured to apply a force to the second part to generate a displacement of the second part, wherein the apparatus is configured to:
        in a first mode of operation, operate the at least two actuators to generate a translational displacement of the second part relative to the first part to provide a first acoustic amplitude of sound from the translational displacement of the second part; and
        in a second mode of operation, operate at least one of the at least two actuators to generate a non-translational displacement of the second part relative to the first part to provide a second acoustic amplitude of sound from the non-translational displacement of the second part which is less than the first acoustic amplitude of sound.

2. The apparatus as claimed in claim 1, wherein the coupling is an elastic body affixed to the first part and the second part and the elastic body is constructed from at least one of:
    silicone;
    thermoplastic elastomer (TPE);
    thermoplastic polyurethane (TPU); and
    rubber.

3. The apparatus as claimed in claim 1, wherein the first part comprises:
    a body part at least partially framing the second part, wherein the coupling is configured to be affixed between the body part and an associated section of the second part.

4. The apparatus as claimed in claim 1, wherein the coupling is configured to produce a substantially continuous interface between the first part and the second part.

5. The apparatus as claimed in claim 1, wherein the second part comprises at least one of:
    a front window layer;
    at least one display layer; and
    at least one touch interface layer.

6. The apparatus as claimed in claim 1, further comprising a driver configured to drive at least one of the at least two actuators dependent on a mode determination signal.

7. The apparatus as claimed in claim 6, wherein the mode determination signal comprises at least one of:
    a hands-free mode determination signal, wherein the driver is configured to drive the at least two actuators; and
    a hands-portable mode determination signal, wherein the driver is configured to drive the at least one of the at least two actuators.

8. The apparatus as claimed in claim 7, further comprising a mode determiner configured to determine the mode determination signal dependent on at least one of:
    at least one proximity sensor;
    an apparatus orientation sensor; and
    an apparatus operating system setting.

9. The apparatus as claimed in claim 7, wherein at least one of the actuators is configured to be operated dependent on at least one power characteristic of the apparatus.

10. The apparatus as claimed in claim 9, wherein the power characteristic of the apparatus comprises at least one of:
    electrical power consumption of at least part of the apparatus;
    battery capacity of the apparatus; and
    estimated time to battery discharge of the apparatus.

11. The apparatus as claimed in claim 1, further comprising a filter configured to filter a signal to operate the at least two actuators to cause a haptic feedback and/or an acoustic signal.

12. The apparatus as claimed in claim 11, wherein the filter comprises at least one of:
    a low pass filter;
    an equaliser;
    a band pass filter; and
    an adjustable filter.

13. The apparatus as claimed in claim 12, wherein the filter is at least one of:
    adaptively controlled; and
    fixed.

14. The apparatus as claimed in claim 1, further comprising a damper coupled between at least one of the actuators and the second part to convert an actuator bending movement of the at least one actuator to the translational displacement of the second part.

15. The apparatus as claimed in claim 1 wherein the apparatus is configured such that during the first mode of operation the translational displacement of the second part relative to the first part moves a majority of a front of the display with the translational displacement.

16. The apparatus as claimed in claim 1 wherein the apparatus is configured such that during the second mode of operation the non-translational displacement of the second part relative to the first part rotates the second part relative to the first part with the non-translational displacement.

17. The apparatus as claimed in claim 1 wherein:
    in the second mode of operation, the apparatus is configured to dampen displacement of at least a portion of the second part relative to the first part to provide the non-translational displacement of the second part, and
    in the first mode of operation, the apparatus is configured to not dampen displacement of the portion of the second part relative to the first part to provide the translational displacement of the second part.

18. The apparatus as claimed in claim 17 wherein the apparatus comprises at least one controllable mechanical coupling configured to alternatively pass or filter one or more actuation force from at least one of the actuators to the second part.

19. The apparatus as claimed in claim 1 where the second part comprises a front window and/or a display assembly comprising layers, and where, in the first mode of operation, the at least two actuators are configured to generate the translational displacement of the second part comprising at least one of:
- an entirety of the front window having the translational displacement, and
- an entirety of the at least one layer of the display assembly having the translational displacement.

20. A method comprising:
- providing a first part configured to form at least part of a case of the apparatus;
- providing a second part configured to form at least part of a display for the apparatus;
- coupling the first part to the second part; and
- applying a force to the second part by at least one of at least two actuators coupled to the second part to generate a displacement of the second part comprising:
  - in a first mode, operating the at least two actuators to generate a translational displacement of the second part relative to the first part to provide a first acoustic amplitude of sound from the translational displacement of the second part; and
  - in a second mode, operating at least one of the at least two actuators to generate a non-translational displacement of the second part relative to the first part to provide a second acoustic amplitude of sound from the non-translational displacement of the second part which is less than the first acoustic amplitude of sound.

21. The method as claimed in claim 20, further comprising driving at least one of the at least two actuators dependent on a mode determination signal, wherein the mode determination signal comprises at least one of:
- a hands-free mode determination signal, wherein driving at least one of the at least two actuators dependent on a mode determination signal comprises driving the at least two actuators to generate the translational displacement; and
- a hands-portable mode determination signal, wherein driving at least one of the at least two actuators dependent on a mode determination signal comprises driving the at least one of the at least two actuators to generate the non-translational displacement.

22. The method as claimed in claim 21, further comprising determining the mode determination signal dependent on at least one of:
- at least one proximity sensor;
- an apparatus orientation sensor; and
- an apparatus operating system setting.

23. A method as in claim 20 further comprising:
- in the second mode, dampening displacement of at least a portion of the second part relative to the first part to provide the non-translational displacement of the second part, and
- in the first mode, not dampening displacement of the portion of the second part relative to the first part to provide the translational displacement of the second part.

24. A method as in claim 23 wherein the dampening comprises controlling at least one controllable mechanical coupling configured to alternatively pass and filter one or more actuation force from at least one of the actuators to the second part.

25. A non-transitory program storage device readable by a machine, tangibly embodying a program of instructions executable by the machine for performing operations, the operations comprising:
- controlling at least two actuators to, in a first mode, generate a translational displacement of a second part relative to a first part, where the first part forms at least part of a case of an apparatus, and where the second part forms at least part of a display for the apparatus, where a majority of the display is displaced by the at least two actuators with the translational displacement during the first mode to provide a first acoustic amplitude of sound from the translational displacement of the second part; and
- controlling at least one of the at least two actuators to, in a second mode, generate a non-translational displacement of the second part relative to the first part to provide a second acoustic amplitude of sound from the non-translational displacement of the second part which is less than the first acoustic amplitude of sound.

* * * * *